(12) United States Patent
Won et al.

(10) Patent No.: US 11,675,224 B2
(45) Date of Patent: *Jun. 13, 2023

(54) DISPLAY DEVICE

(71) Applicant: SAMSUNG DISPLAY CO., LTD., Yongin-si (KR)

(72) Inventors: Byeong Hee Won, Incheon (KR); Yi Joon Ahn, Seoul (KR); Jung Hun Noh, Yongin-si (KR); Jae Woo Im, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/473,008

(22) Filed: Sep. 13, 2021

(65) Prior Publication Data

US 2021/0405428 A1  Dec. 30, 2021

Related U.S. Application Data

(63) Continuation of application No. 16/724,884, filed on Dec. 23, 2019, now Pat. No. 11,119,345.

(30) Foreign Application Priority Data

Dec. 27, 2018 (KR) ........................ 10-2018-0170555

(51) Int. Cl.
*G02F 1/1333* (2006.01)
*H01L 23/498* (2006.01)

(52) U.S. Cl.
CPC .. *G02F 1/133308* (2013.01); *G02F 1/133305* (2013.01); *G02F 1/133382* (2013.01); *H01L 23/4985* (2013.01)

(58) Field of Classification Search
None
See application file for complete search history.

(56) References Cited

U.S. PATENT DOCUMENTS

| 10,917,708 | B2* | 2/2021 | Won | H04R 9/06 |
| 10,924,860 | B2* | 2/2021 | Won | H01L 51/5246 |
| 11,119,345 | B2* | 9/2021 | Won | G02F 1/133382 |
| 2016/0268546 | A1* | 9/2016 | Lee | H01L 51/5237 |
| 2019/0018448 | A1 | 1/2019 | Lee et al. | |
| 2020/0209674 | A1 | 7/2020 | Won et al. | |

* cited by examiner

*Primary Examiner* — Ashok Patel
(74) *Attorney, Agent, or Firm* — F. Chau & Associates, LLC

(57) ABSTRACT

A display device that includes a display panel having a first substrate, a second substrate, and a light-emitting element layer. The light emitting layer is disposed between the first and second substrates and is configured to emit light in a direction toward the second substrate. A first sound generator is disposed on a first surface of the first substrate and is configured to vibrate the display panel to output a first sound. A first heat dissipation film is disposed between the first substrate and the first sound generator.

20 Claims, 39 Drawing Sheets

↑ Polarity direction

FIG. 13A
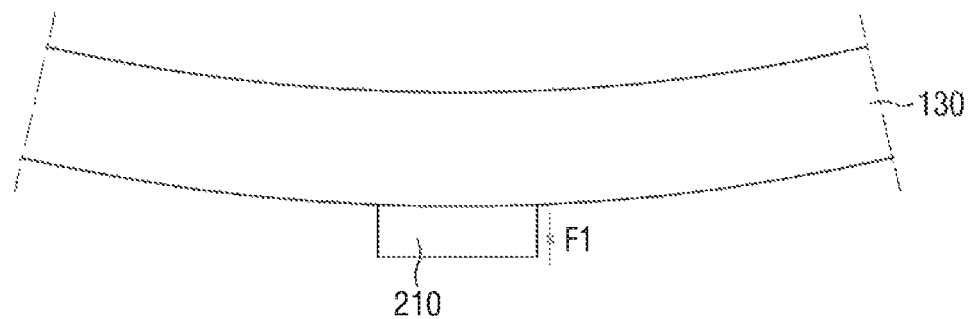
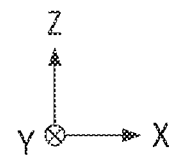

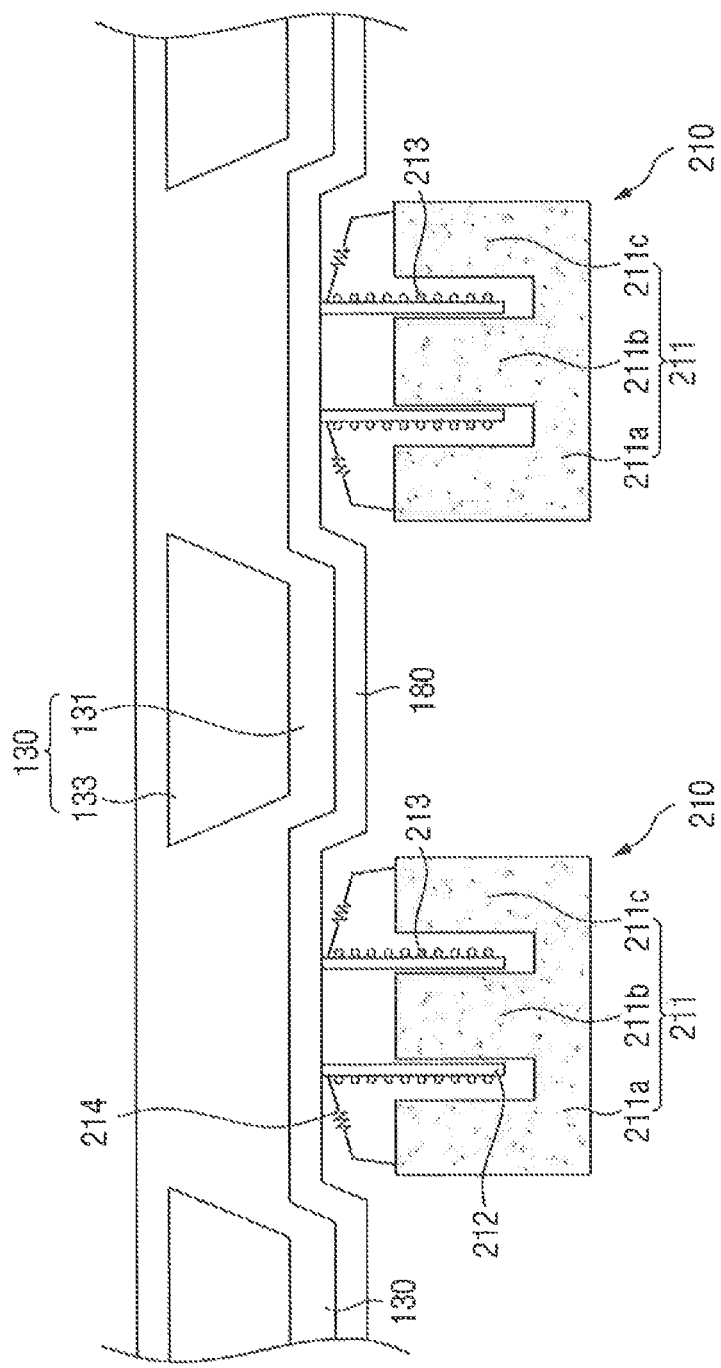

DISPLAY DEVICE

CROSS-REFERENCE TO RELATED APPLICATIONS

This application is a continuation of U.S. patent application Ser. No. 16/724,884 filed on Dec. 23, 2019, which claims priority under 35 U.S.C § 119 to Korean Patent Application No. 10-2018-0170555, filed on Dec. 27, 2018, in the Korean Intellectual Property Office (KIPO), the disclosures of which are incorporated by reference in their entireties herein.

1. TECHNICAL FIELD

The present disclosure relates to a display device.

2. DISCUSSION OF RELATED ART

The demand for display devices that are configured to display images has increased and diversified as the information society has developed. For example, display devices have been included in a variety of electronic devices including smart phones, digital cameras, notebook computers, navigation devices, smart televisions (TV), etc. Examples of display devices include flat panel display devices, such as a liquid crystal display (LCD) device, a field emission display (FED) device, an organic light-emitting diode (OLED) display device, etc.

A display device may include a display panel for displaying an image and a speaker for providing sound. Sound may preferably be output from the speaker in the front direction of the display device for improved sound quality. However, due to the limited space of display devices, the speaker is often disposed at the rear or on one side of the display panel. This results in the display device outputting a low quality sound.

SUMMARY

Exemplary embodiments of the present disclosure may provide a display device capable of improving the quality of sound by causing a display panel to vibrate and thereby outputting sound in the front direction thereof.

According to an exemplary embodiment of the present inventive concepts, a display device includes a display panel having a first substrate, a second substrate, and a light-emitting element layer. The light-emitting layer is disposed between the first and second substrates and is configured to emit light in a direction toward the second substrate. A first sound generator is disposed on a first surface of the first substrate and is configured to vibrate the display panel to output a first sound. A first heat dissipation film is disposed between the first substrate and the first sound generator.

According to another exemplary embodiment of the present inventive concepts, a display device includes a display panel. A first sound generator is disposed on a first surface of the display panel and is configured to vibrate the display panel to output a sound. A first heat dissipation film is disposed between the display panel and the first sound generator. The first heat dissipation film includes a hole overlapping with the first sound generator.

According to a further exemplary embodiment of the present inventive concepts, a display device includes a display panel. The display panel includes a first substrate, a second substrate, a light-emitting element layer disposed between the first and second substrates, and a heat dissipation film disposed on the first substrate. The heat dissipation film includes a heat dissipation layer and at least one vibration transmission layer. At least one sound generator is disposed on the heat dissipation film and is configured to vibrate the first substrate through the at least one vibration transmission layer of the heat dissipation film to output a sound. The display panel serves as a diaphragm for generating the sound.

According to the aforementioned and other exemplary embodiments of the present disclosure, since a first sound generator outputs first sound using a display panel as a diaphragm, sound can be output in the front direction of a display device, and as a result, the quality of the sound can be improved. Also, due to the first sound generator, a speaker can be omitted from the rear or a side of the display panel.

In addition, since multiple sound generators are provided on one surface of the display panel, multi-channel stereo sound can be provided to a user.

Moreover, since heat dissipating pass holes may be formed on a first heat dissipation film to overlap with a first sound generator, heat generated by the first sound generator can be effectively released by the heat dissipation pass holes. Accordingly, the influence of the heat generated by the first sound generator on the display panel can be minimized by the first heat dissipation film.

Furthermore, since a second heat dissipation film is further disposed between the first heat dissipation film and the first sound generator, the heat generated by the first sound generator can be further blocked by the second heat dissipation film and can thus be prevented from affecting the display panel.

Other features and exemplary embodiments may be apparent from the following detailed description, the drawings, and the claims.

BRIEF DESCRIPTION OF THE DRAWINGS

The above and other embodiments and features of the present disclosure will become more apparent by describing in detail exemplary embodiments thereof with reference to the attached drawings, in which:

FIGS. 13A and 13B are side views illustrating the vibration of a display panel caused by the first sound generator of FIGS. 10 and 11 according to an exemplary embodiment of the present inventive concepts;

FIG. 29B is a cross-sectional view taken along line VI-VI' of FIG. 29A according to an exemplary embodiment of the present inventive concepts;

DETAILED DESCRIPTION OF THE EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein. The same reference numbers indicate the same components throughout the specification. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present invention will be described with reference to the attached drawings.

Figure 1:
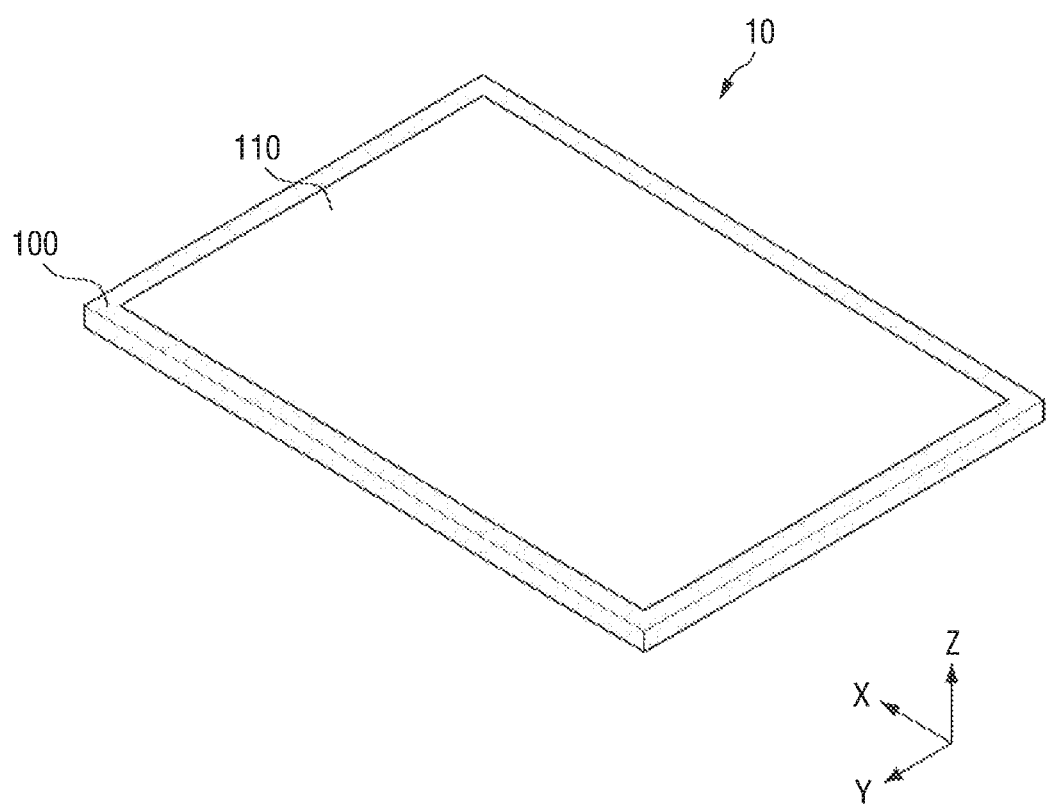
FIG. 1 is a perspective view of a display device according to an exemplary embodiment of the present inventive concepts.
Figure 2:
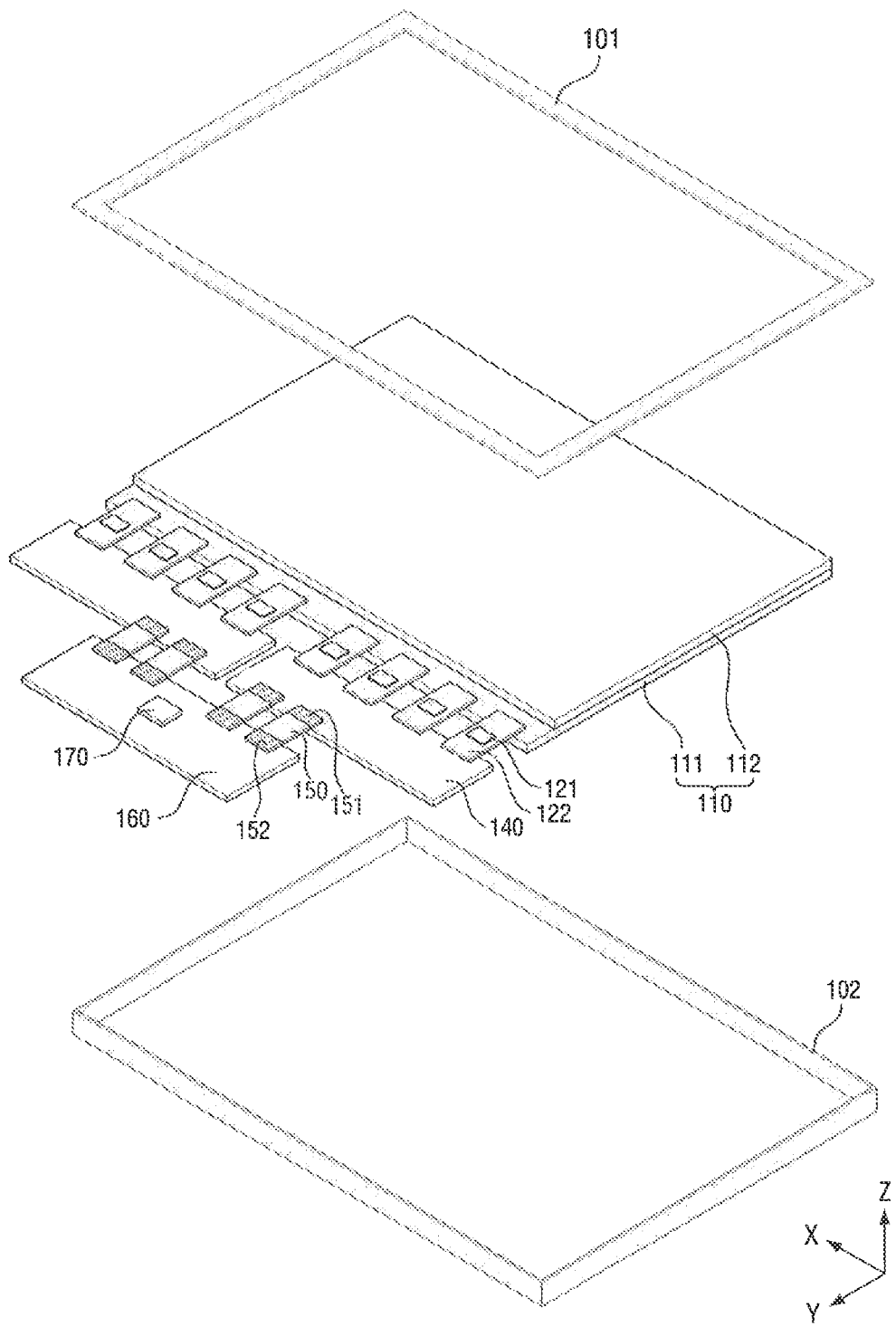
FIG. 2 is an exploded perspective view of the display device of FIG. 1 according to an exemplary embodiment of the present inventive concepts.
Figure 3:
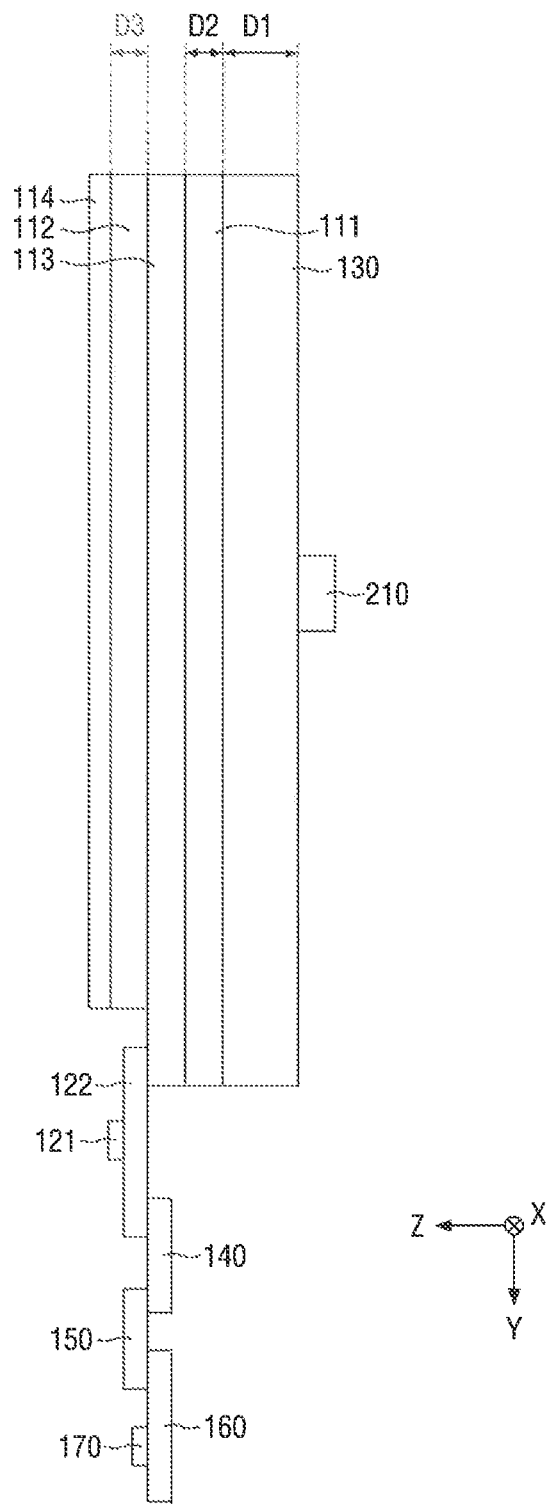
FIG. 3 is a side view illustrating an exemplary display panel of FIG. 2 according to an exemplary embodiment of the present inventive concepts.

Referring to FIGS. 1 through 3, a display device 10 will hereinafter be described as being, for example, an organic light-emitting diode (OLED) display device. However, exemplary embodiments of the present inventive concepts are not limited thereto. For example, in certain exemplary embodiments, the display device 10 may be a micro light-emitting diode (LED) display device or an inorganic LED display device using an inorganic semiconductor (e.g., inorganic LEDs).

The display device 10 may include a cover frame 100, a display panel 110, source driving circuits 121, flexible films 122, source circuit boards 140, flexible cables 150, a control circuit board 160, and a timing control circuit 170.

The terms "above", "top", and "top surface", as used herein, denote a direction in which a second substrate 112 of the display panel 110 is disposed with respect to a first substrate 111 of the display panel 110, e.g., a Z-axis direction. The terms "below", "bottom", and "bottom surface", as used herein, denote a direction in which the first substrate 111 is disposed with respect to the second substrate 112, i.e., the direction opposite to the Z-axis direction. The terms "left", "right", "upper", and "lower", as used herein, denote the respective directions as viewed from above the display panel 110. For example, the term "left" denotes an X-axis direction, the term "right" denotes the direction opposite to the X-axis direction, the term "lower" may denote a Y-axis direction, and the term "upper" may denote the direction opposite to the Y-axis direction.

The cover frame 100 may be disposed to cover the edges of the display panel 110. The cover frame 100 may cover a non-display area of the display panel 110. The cover frame 100 may not cover a display area of the display panel 110. Specifically, as illustrated in FIG. 2, the cover frame 100 may include upper and lower covers 101 and 102. In an exemplary embodiment, the upper cover 101 may cover the edges of the top surface of the display panel 110, and the lower cover 102 may cover the bottom surface and the side surfaces of the display panel 110. The upper and lower covers 101 and 102 may be coupled to each other via a fixing member. The upper and lower covers 101 and 102 may be formed of plastic or a metal or may include both plastic and a metal.

In an exemplary embodiment, the display panel 110 may have a rectangular shape in a plan view. For example, in a plan view, the display panel 110 may have a rectangular shape having its relatively longer sides extending in a first direction (e.g., the X-axis direction) and its relatively shorter sides extending in a second direction (e.g., the Y-axis direction). The corners where the long sides and the short sides meet may be right-angled or rounded. However, the planar shape of the display panel 110 is not particularly limited. Accordingly, in exemplary embodiments the display panel 110 may be formed in various other shapes such as a polygonal shape other than a rectangular shape, a circular shape, or an elliptical shape.

The exemplary embodiment shown in FIG. 2 includes a display panel 110 that is flat. However, exemplary embodiments of the present inventive concepts are not limited thereto and the display panel 110 may be formed to have a bend with a predetermined curvature.

The display panel 110 may include the first and second substrates 111 and 112. The first and second substrates 111 and 112 may be formed to be rigid or flexible. In exemplary embodiments, the first substrate 111 may be formed of glass or plastic, and the second substrate 112 may be formed of glass, plastic, an encapsulation film, or a barrier film. For example, each of the first and second substrates 111 and 112 may include plastic such as polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. For example, each of the first and second substrates 111 and 112 may include an encapsulation film or a barrier film in which a plurality of inorganic films are stacked.

Figure 4:
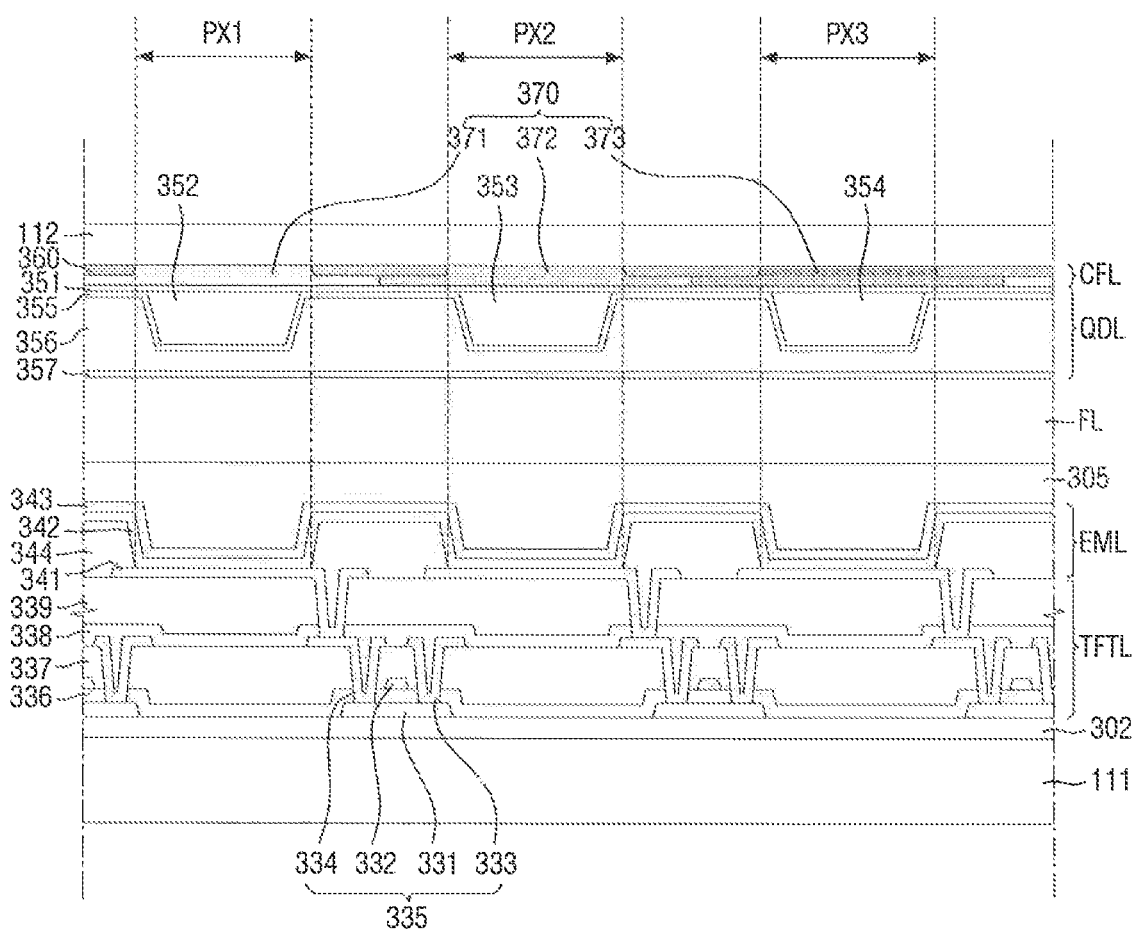
FIG. 4 is a cross-sectional view illustrating a display area of the display panel of FIG. 2 according to an exemplary embodiment of the present inventive concepts.

As shown in FIG. 3, the display panel 110 may include a display layer 113 disposed between the first and second substrates 111 and 112. As shown in FIG. 4, the display layer 113 may include a thin-film transistor (TFT) layer TFTL, a light-emitting element layer EML, a thin-film encapsulation layer (TFEL) 305, a filler member FL, a light wavelength conversion layer QDL, and a color filter layer CFL. In an exemplary embodiment, the first substrate 111 may be a TFT substrate on which the TFT layer TFTL, the light-emitting element layer EML, and the TFEL 305 are formed. The second substrate 112 may be a color filter substrate on which the light wavelength conversion layer QDL and the color filter layer CFL are formed. The filler member FL may be disposed between the TFEL 305 on the first substrate 111 and the light wavelength conversion layer QDL on the second substrate 112. The display layer 113 will be described later in further detail with reference to FIG. 4.

Since the first substrate 111 may have a larger size than the second substrate 112, one side of the first substrate 111 may not be covered by the second substrate 112, but may be exposed. The flexible films 122 may be attached to a part of the first substrate 111 that is not covered by the second substrate 112. In an exemplary embodiment, the flexible films 122 may be tape carrier packages or chip-on-films. The flexible films 122 may be attached on the first substrate 111 via an anisotropic conductive film using a tape automated bonding (TAB) method, and as a result, the source driving circuits 121 may be connected to data lines.

The flexible films 122 may be bendable. For example, the flexible films 122 may be bent toward the bottom surface of the first substrate 111. As illustrated in the exemplary embodiment shown in FIG. 6, the source circuit boards 140, the flexible cables 150, and the control circuit board 160 may be disposed on the bottom surface of the first substrate 111.

In the exemplary embodiment shown in FIG. 2, eight flexible films 122 are attached on the first substrate 111 of the display panel 110. However, the number of flexible films 122 provided is not particularly limited.

The source driving circuits 121 may be attached on the flexible films 122. The source driving circuits 121 may be formed as integrated circuits (ICs). The source driving circuits 121 may convert digital video data into analog data voltages in accordance with source control signals received from the timing control circuit 170. The source driving circuits 121 may provide the analog data voltages to the data lines of the display panel 110 via the flexible films 122.

First sides of the flexible films 122 may be attached on the first substrate 111 of the display panel 110, and second sides of the flexible films 122 may be attached on the source circuit boards 140. The source circuit boards 140 may be connected to the control circuit board 160 via the flexible cables 150. The source circuit boards 140 may include first connectors 151 for connecting the source circuit boards 140 to the flexible cables 150. In an exemplary embodiment, the source circuit boards 140 may be printed circuit boards (PCBs) or flexible PCBs (FPCBs).

The control circuit board 160 may be connected to the source circuit boards 140 via the flexible cables 150. To this end, the control circuit board 160 may include second connectors 152 for connecting the control circuit board 160 to the flexible cables 150. The control circuit board 160 may be a PCB or an FPCB.

In the exemplary embodiment illustrated in FIG. 2, four flexible cables 150 are provided to connect the source circuit boards 140 and the control circuit board 160. However, the number of flexible cables 150 provided is not particularly limited. The exemplary embodiment illustrated in FIG. 2 has two source circuit boards 140. However, the number of source circuit boards 140 provided is not particularly limited.

The timing control circuit 170 may be attached on the control circuit board 160. The timing control circuit 170 may be formed as an IC. The timing control circuit 170 may receive digital video data and timing signals from a system-on-chip and may generate source control signals for controlling the timings of the source driving circuits 121 in accordance with the timing signals.

The system-on-chip may be mounted on a system circuit board that is connected to the control circuit board 160 via a flexible cable and may be formed as an IC. The system-on-chip may be a processor of a smart television (TV), a central processing unit (CPU) a graphics card of a computer or a notebook computer, an application processor of a smartphone or a tablet personal computer (PC), etc.

A power supply circuit may be additionally attached on the control circuit board 160. The power supply circuit may generate voltages necessary for driving the display panel 110 based on the main power applied from the system circuit board. The power supply circuit may supply the generated voltages to the display panel 110. For example, the power supply circuit may generate a high-potential voltage, a low-potential voltage, and an initialization voltage for driving OLEDs. The power supply circuit may supply the high-potential voltage, the low-potential voltage, and the initialization voltage to the display panel 110. The power supply circuit may also generate and supply driving voltages for driving the source driving circuits 121 and the timing control circuit 170. The power supply circuit may be formed as an IC.

A first heat dissipation film 130 may be disposed on a surface of the first substrate 111 that does not face the second substrate 112. For example, the first heat dissipation film 130 may be disposed on the bottom surface of the first substrate 111. A first sound generator 210 may be disposed on a surface of the first heat dissipation film 130 that does not face the first substrate 111. For example, the sound generator 210 may be disposed on the bottom surface of the first heat dissipation film 130.

The first heat dissipation film 130 dissipates heat generated by the voice coil of the first sound generator 210. In an exemplary embodiment, the first heat dissipation film 130 may include a layer of a metal with high thermal conductivity such as graphite, silver (Ag), copper (Cu), or aluminum (Al).

The first heat dissipation film 130 may include a plurality of metal layers formed not in a third direction (e.g., the Z-axis direction), but in the first direction (e.g., the X-axis direction) and the second direction (e.g., the Y-axis direction). In this embodiment, heat generated by the voice coil of the first sound generator 210 may be diffused in the first direction (e.g., the X-axis direction) and in the second direction (e.g., the Y-axis direction) to effectively release the heat. The first direction (e.g., the X-axis direction) may be the width direction of the display panel 110, the second direction (e.g., the Y-axis direction) may be the height direction of the display panel 110, and the third direction (e.g., the Z-axis direction) may be the thickness direction of the display panel 110. Accordingly, the influence of heat generated by the first sound generator 210 on the display panel 110 may be minimized by the first heat dissipation film 130.

The relative thicknesses D1, D2, D3 of the first heat dissipation film, first substrate and second substrate, respectively, may be configured to prevent heat generated by the first sound generator 210 from affecting the display panel 110. For example, a thickness D1 of the first heat dissipation film 130 may be greater than a thickness D2 of the first substrate 111 and a thickness D3 of the second substrate 112.

In the exemplary embodiment illustrated in FIG. 3, the first heat dissipation film 130 covers the entire surface of the first substrate 111. However, exemplary embodiments of the present inventive concepts are not limited thereto.

The first heat dissipation film 130 will be described later in further detail with reference to FIGS. 20, 23 through 29, 30A, 30B, and 31 through 33.

The first sound generator 210 may be a vibrating device that may be configured to cause the display panel 110 to vibrate in the third direction (e.g., the Z-axis direction). For example, as illustrated in the exemplary embodiments shown in FIGS. 7, 8, 9A, and 9B, the first sound generator 210 may be an exciter configured to generate a magnetic force using a voice coil which causes the display panel 110 to vibrate. As illustrated in the exemplary embodiments shown in FIGS. 10, 11, 12, 13A, and 13B, the first sound generator 210 may alternatively be a piezoelectric element that contracts or expands in accordance with a voltage applied thereto and thereby causes the display panel 110 to vibrate. The display panel 110 may serve as a diaphragm for outputting first sound.

As described above, according to the exemplary embodiments of FIGS. 1 through 3, the display device 10 may be configured to output a first sound using the display panel 110 as a diaphragm. Since the display device 10 may output sound in the front direction thereof, the quality of the outputted sound may be improved. Further, due to the presence of the first sound generator 210, a speaker disposed on the bottom surface or a side of a typical display device may be omitted.

In the exemplary embodiments shown in FIGS. 1-3, the display device 10 may be a mid-size to large-size display device including a plurality of source driving circuits 121. However, the present disclosure is not limited thereto. For example, the display device 10 may be a small-size display device including only one source driving circuit 121. In this embodiment, the flexible films 122, the source circuit boards 140, and the flexible cables 150 may not be provided. The source driving circuit 121 and the timing control circuit 170 may be incorporated into a single IC and may then be attached on a single FPCB or on the second substrate 112 of the display panel 110. Examples of a mid-size to large-size display device include a monitor, a TV, etc. Examples of a small-size display device include a smartphone, a tablet PC, etc.

FIG. 4 is a cross-sectional view illustrating an exemplary display area of an exemplary display panel.

Referring to FIG. 4, a display panel 110 may include a first substrate 111, a second substrate 112, a TFT layer TFTL, a light-emitting element layer EML, a TFEL 305, a filler member FL, a wavelength conversion layer QDL, and a color filter layer CFL.

A buffer film 302 may be formed on a surface of the first substrate 111 that faces the second substrate 112. The buffer film 302 may be formed on the first substrate 111 to protect TFTs 335 and light-emitting elements against moisture penetrating the first substrate 111, which may be susceptible to moisture. The buffer film 302 may include a plurality of inorganic films that are alternately stacked. For example, the buffer film 302 may be formed as a multilayer film in which a silicon oxide (SiOx) film, a silicon nitride (SiNx) film, and/or a silicon oxynitride (SiON) film are alternately stacked. The buffer film 302 may not be provided.

The TFT layer TFTL is formed on the buffer film 302. The TFT layer TFTL includes TFTs 335, a gate insulating film 336, an interlayer insulating film 337, a passivation film 338, and a planarization film 339.

The TFTs 335 are formed on the buffer film 302. Each of the TFTs 335 may include an active layer 331, a gate electrode 332, a source electrode 333, and a drain electrode 334. The exemplary embodiment shown in FIG. 4 includes TFTs 335 having a top gate structure in which the gate electrode 332 is disposed above the active layer 331. However, exemplary embodiments of the present inventive concepts are not limited thereto. The TFTs 335 may have a bottom gate structure in which the gate electrode 332 is disposed below the active layer 331 or a double gate structure in which the gate electrode is disposed both above and below the active layer.

The active layer 331 may be formed on the buffer film 302. The active layer 331 may be formed of a silicon-based semiconductor material or an oxide-based semiconductor material. A light-shielding layer for blocking external light incident on the active layer 331 may be formed between the buffer layer and the active layer.

A gate insulating film 336 may be formed on the active layer 331. The gate insulating film 316 may be formed as an inorganic film such as, for example, a silicon oxide film, a silicon nitride film, or a multilayer film thereof.

The gate electrode 332 and a gate line may be formed on the gate insulating film 316. The gate electrode 332 and the gate line may be formed as single- or multilayer films using molybdenum (Mo), Al, chromium (Cr), gold (Au), titanium (Ti), Ni, neodymium (Nd), Cu, or an alloy thereof.

The interlayer insulating film 337 may be formed on the gate electrode 332 and the gate line. The interlayer insulating film 337 may be formed as an inorganic film such as, for example, a silicon oxide film, a silicon nitride film, or a multilayer film thereof.

The source electrode 333, the drain electrode 334, and a data line may be formed on the interlayer insulating film 337. The source electrode 333 and the drain electrode 334 may be connected to the active layer 331 through contact holes penetrating the gate insulating film 336 and the interlayer insulating film 337. The source electrode 333, the drain electrode 334, and the data line may be formed as a single layer film or multilayer films using Mo, Al, Cr, Au, Ti, Ni, Nd, Cu, or an alloy thereof.

The passivation film 338 may be formed on the source electrode 333, the drain electrode 334, and the data line to insulate the TFTs 335. The passivation film 338 may be formed as an inorganic film such as, for example, a silicon oxide film, a silicon nitride film, or a multilayer film thereof.

The planarization film 339 may be formed on the passivation film 338 to planarize height differences formed by the TFTs 335. The planarization film 339 may be formed as an organic film using an acrylic resin, an epoxy resin, a phenolic resin, a polyamide resin, or a polyimide resin.

The light-emitting element layer EML may be formed on the TFT layer TFTL. The light-emitting element layer EML may include light-emitting elements and a pixel defining film 344.

The light-emitting elements and the pixel defining film 344 may be formed on the planarization film 339. In an exemplary embodiment, the light-emitting elements may be OLEDs. In this embodiment, each of the light-emitting elements may include an anode electrode 341, a light-emitting layer 342, and a cathode electrode 343.

The anode electrode 341 may be formed on the planarization film 339. The anode electrode 341 may be connected to the source electrode 333 through a contact hole penetrating the passivation film 338 and the planarization film 339.

The pixel defining film 344 may be formed to cover the edges of the anode electrode 341 to define a corresponding pixel. The pixel defining film 344 may define a plurality of first, second, and third subpixels PX1, PX2, and PX2. Each of the first, second, and third subpixels PX1, PX2, and PX3 may be a region in which the anode electrode 341, the light-emitting layer 342, and the cathode electrode 343 are sequentially stacked and holes from the anode electrode 341 and electrons from the cathode electrode 343 are combined in the light-emitting layer 342 to emit light.

The light-emitting layer 342 may be formed on the anode electrode 341 and the pixel defining film 344. The light-emitting layer 342 may be an organic light-emitting layer. The light-emitting layer 342 may emit blue light or short-wavelength light such as ultraviolet (UV) light. The peak wavelength range of the blue light may be about 450 nm to 490 nm, and the peak wavelength range of the UV light may be 450 nm or shorter. In this embodiment, the light-emitting layer 342 may be a common layer that is formed in common for all the first, second, and third subpixels PX1, PX2, and PX3. The display panel 110 may include a light wavelength conversion layer QDL, which converts the blue light or the short-wavelength light (such as UV light) emitted by the light-emitting layer 342 into red light, green light, and blue light. The display panel 110 may also include the color filter layer CFL which transmit red light, green light, and blue light therethrough.

The light-emitting layer 342 may include a hole transport layer, an emission layer, and an electron transport layer. The light-emitting layer 342 may have a tandem structure with two or more stacks. In this embodiment, a charge generating layer may be formed between the stacks.

The cathode electrode 343 may be formed on the light-emitting layer 342. The cathode electrode 343 may be formed to cover the light-emitting layer 342. The cathode electrode 343 may be a common layer formed commonly for all pixels.

The light-emitting element layer EML may he formed as a top emission-type light-emitting element layer that emits light in a direction toward the second substrate 112, e.g., in an upper direction. In this embodiment, the anode electrode 341 may be formed of a metal material with high reflectance such as a stack of Al and Ti (e.g., Ti/Al/Ti), a stack of Al and indium tin oxide (ITO) (e.g., ITO/Al/ITO), a silver (Ag)-palladium (Pd)-copper (Cu) (APC) alloy, or a stack of an APC alloy and ITO (e.g., ITO/APC/ITO). The cathode electrode 343 may be formed of a transparent conductive oxide (TCO) material such as ITO or indium zinc oxide (IZO) that may transmit light therethrough or a semi-transmissive conductive material such as magnesium (Mg), Ag, or an alloy thereof. In an embodiment where the cathode electrode 343 is formed of a semi-transmissive conductive material, the emission efficiency of the light-emitting element layer EML may be improved due to a micro-cavity effect.

The TFEL 305 is formed on the light-emitting element layer EML. The TFEL 305 prevents oxygen or moisture from infiltrating into the light-emitting layer 342 and the cathode electrode 343. The TFEL 305 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide. The TFEL 305 may further include at least one organic film. The organic film may have a sufficient thickness to prevent foreign particles from entering the light-emitting layer 342 and the cathode electrode 343 through the TFEL 305. The organic film may include one of epoxy, acrylate, and urethane acrylate.

The color filter layer CFL is disposed on a surface of the second substrate 112 that faces the first substrate 111. The color filter layer CFL may include a black matrix 360 and color filters 370.

The black matrix 360 may be formed on the second substrate 112. The black matrix 360 may be disposed to overlap with the pixel defining film 344. However, the black matrix may be disposed so that it does not overlap with the first, second, and third subpixels PX1, PX2, and PX3. The black matrix 360 may include a black pigment or an opaque metal material that may be capable of blocking the transmission of light without transmitting light therethrough.

The color filters 370 may be disposed to overlap with the first, second, and third subpixels PX1, PX2, and PX3. A first color filter 371 may be disposed to overlap with the first subpixel PX1, a second color filter 372 may be disposed to overlap with the second subpixel PX2, and a third color filter 373 may be disposed to overlap with the third subpixel PX3. In this embodiment, the first color filter 371 may be a first-color light transmitting filter transmitting light of a first color, the second color filter 372 may be a second-color light transmitting filter transmitting light of a second color, and the third color filter 373 may be a third-color light transmitting filter transmitting light of a third color. For example, in an exemplary embodiment, the first, second, and third colors may be red, green, and blue, respectively. However, exemplary embodiments of the present inventive concepts are not limited thereto. The peak wavelength range of red light passing through the first color filter 371 may be about 620 nm to 750 nm. The peak wavelength range of green light passing through the second color filter 372 may be about 500 nm to 570 nm. The peak wavelength range of blue light passing through the third color filter 373 may be about 450 nm to 490 nm.

The boundaries between the color filters 370 may overlap with the black matrix 360. Accordingly, the black matrix 370 may prevent light emitted from the light-emitting layer 342 of one subpixel from entering the color filter 370 of another subpixel to cause color mixing.

An overcoat layer may be formed on the color filters 370 in order to planarize height differences caused by the color filters 370 and the black matrix 360. However, in certain exemplary embodiments, the overcoat layer may not be provided.

The wavelength conversion layer QDL may be disposed on the color filter layer CFL. The wavelength conversion layer QDL may include a first capping layer 351, a first wavelength conversion layer 352, a second wavelength conversion layer 353, a third wavelength conversion layer 354, a second capping layer 355, an interlayer organic film 356, and a third capping layer 357.

The first capping layer 351 may be disposed on the color filter layer CFL. The first capping layer 351 prevents moisture or oxygen from infiltrating into the first, second, and third wavelength conversion layers 352, 353, and 354 through the color filter layer CFL. The first capping layer 351 may be formed as an inorganic film using, for example, silicon nitride, aluminum nitride, zirconium nitride, titanium nitride, hafnium nitride, tantalum nitride, silicon oxide, aluminum oxide, or titanium oxide.

The first, second, and third wavelength conversion layers 352, 353, and 354 may be disposed on the first capping layer 351.

The first wavelength conversion layer 352 may be disposed to overlap with the first subpixel PX1. The first wavelength conversion layer 352 may convert the blue Light or the short-wavelength light (such as UV light) emitted from the light-emitting layer 342 of the first subpixel PX1 into light of the first color. The first wavelength conversion layer 352 may include a first base resin, a first wavelength shifter, and a first scatterer.

The first base resin may be formed of a material having high light transmittance and excellent dispersion characteristics for the first wavelength shifter and the first scatterer. For example, the first base resin may include an organic material such as an epoxy resin, an acrylic resin, a cardo resin, or an imide resin.

The first wavelength shifter may convert or shift the wavelength of incident light. In an exemplary embodiment, the first wavelength shifter may be quantum dots, quantum rods, or a phosphor. In the embodiment where the first wavelength shifter is quantum dots, which may be a semiconductor nanocrystal material, the first wavelength shifter may have a predetermined band gap depending on the composition and the size thereof. Therefore, the first wavelength shifter may absorb incident light and may then emit light of a predetermined wavelength. The first wavelength shifter may have a core-shell structure consisting of a core including nanocrystals and a shell surrounding the core. In this embodiment, examples of the nanocrystals may include group IV nanocrystals, group II-VI compound nanocrystals, group III-V compound nanocrystals, group IV-VI nanocrystals, or a combination thereof. The shell may serve as a passivation layer for preventing chemical deformation of the core to maintain semiconductor characteristics and/or as a charging layer for imparting the quantum dots electrophoretic characteristics. The shell may be a single layer or multilayer film. Examples of the shell may include an oxide of a metal or a non-metal, a semiconductor compound, or a combination thereof.

The first scatterer may have a different refractive index from the first base resin and may form an optical interface with the first base resin. For example, the first scatterer may be light-scattering particles. For example, the first scatterer may be metal oxide particles such as particles of titanium oxide ($TiO_2$), silicon oxide ($SiO_2$), zirconium oxide ($ZrO_2$), aluminum oxide ($Al_2O_3$), zinc oxide (ZnO), or tin oxide ($SnO_2$). In another exemplary embodiment, the first scatterer may be organic particles such as particles of an acrylic resin or a urethane resin.

The first scatterer may scatter incident light in random directions without substantially changing the wavelength of light passing through the first wavelength conversion layer 352. In this manner, the path of light transmitting the first wavelength conversion layer 352 may be lengthened, and the color conversion efficiency of the first wavelength shifter may be improved.

The first wavelength conversion layer 352 may overlap with the first color filter 371. Therefore, some of the blue light or the short-wavelength light (such as UV light) provided by the first subpixel PX1 may pass through the first wavelength conversion layer 352 as it is without being converted into light of the first color by the first wavelength shifter. However, the blue light or the short-wavelength light (such as UV light) incident upon the first color filter 371 without being converted by the first wavelength conversion layer 352 may not be able to pass through the first color filter 371. On the other hand, the light of the first color obtained by the first wavelength conversion layer 352 may pass through the first color filter 371 and may be emitted in the direction toward the second substrate 112.

The second wavelength conversion layer 353 may be disposed to overlap with the second subpixel PX2. The second wavelength conversion layer 353 may convert the blue light or the short-wavelength light (such as UV light) emitted from the light-emitting layer 342 of the second subpixel PX2 into light of the second color. The second wavelength conversion layer 353 may include a second base resin, a second wavelength shifter, and a second scatterer. The second base resin, the second wavelength shifter, and the second scatterer of the second wavelength conversion layer 353 may be substantially the same as the first base resin, the first wavelength shifter, and the first scatterer, respectively, of the first wavelength conversion layer 352. Accordingly, detailed descriptions thereof will be omitted. However, in an embodiment where the first and second wavelength shifters are both quantum dots, the diameter of the second wavelength shifter may be smaller than the diameter of the first wavelength shifter.

The second wavelength conversion layer 353 may overlap with the second color filter 372. Therefore, some of the blue light or the short-wavelength light (such as UV light) provided by the second subpixel PX2 may pass through the second wavelength conversion layer 353 as it is without being converted into light of the second color by the second wavelength shifter. However, the blue light or the short-wavelength light (such as UV light) incident upon the second color filter 372 without being converted by the second wavelength conversion layer 353 may not be able to pass through the second color filter 372. On the other hand, the light of the second color obtained by the second wavelength conversion layer 353 may pass through the second color filter 372 and may be emitted in the direction toward the second substrate 112.

The third wavelength conversion layer 354 may be disposed to overlap with the third subpixel PX3. The third wavelength conversion layer 354 may convert the blue light or the short-wavelength light (such as UV light) emitted from the light-emitting layer 342 of the third subpixel PX3 into light of the third color. The third wavelength conversion layer 354 may include a third base resin, a third wavelength shifter, and a third scatterer. The third base resin, the third wavelength shifter, and the third scatterer of the third wavelength conversion layer 354 are substantially the same as the first base resin, the first wavelength shifter, and the first scatterer, respectively, of the first wavelength conversion layer 352. Accordingly, detailed descriptions thereof will be omitted.

The third wavelength conversion layer 354 may overlap with the third color filter 373. Therefore, some of the blue light or the short-wavelength light (such as UV light) provided by the third subpixel PX3 may pass through the third wavelength conversion layer 354 as it is and may then be emitted in the direction toward the second substrate 112 through the third color filter 373.

The second capping layer 355 may be disposed on the first, second, and third wavelength conversion layers 352, 353, and 354 and portions of the first capping layer 351 that are exposed without being covered by the first, second, and third wavelength conversion layers 352, 353, and 354. The second capping layer 355 prevents moisture or oxygen from infiltrating into the first, second, and third wavelength conversion layers 352, 353, and 354. The second capping layer 355 may be formed as an inorganic film using, for example, silicon nitride, aluminum nitride, zirconium nitride, titanium nitride, hafnium nitride, tantalum nitride, silicon oxide, aluminum oxide, or titanium oxide.

The interlayer organic film 356 may be disposed on the second capping layer 355. The interlayer organic film 356 may be a planarization layer for planarizing height differences formed by the first, second, and third wavelength conversion layers 352, 353, and 354. The interlayer organic film 356 may be formed as an organic film using an acrylic resin, an epoxy resin, a phenolic resin, a polyamide resin, or a polyimide resin.

The third capping layer 357 may be disposed on the interlayer organic film 356. The third capping layer 357 may be formed as an inorganic film using, for example, silicon nitride, aluminum nitride, zirconium nitride, titanium nitride, hafnium nitride, tantalum nitride, silicon oxide, aluminum oxide, or titanium oxide.

The filler member FL may be disposed between the TFEL 305, which is disposed on the first substrate 111, and the third capping layer 357, which is disposed on the second substrate 112. The filler member FL may be formed of a material having a buffer function. For example, the filler member FL may be formed as an organic film using an acrylic resin, an epoxy resin, a phenolic resin, a polyamide resin, or a polyimide resin.

In a non-display area of the display panel 110, an adhesive layer for bonding the first and second substrates 111 and 112 may be disposed, and in a plan view, the filler member FL may be surrounded by the adhesive layer.

According to the exemplary embodiment of the present inventive concepts shown in FIG. 4, the first, second, and third subpixels PX1, PX2, and PX3 may emit blue light or short-wavelength light such as UV light. The light from the first subpixel PX1 may be converted into light of the first color through the first wavelength conversion layer 352 and may then be output through the first color filter CF1. Light from the second subpixel PX2 may be converted into light of the second color through the second wavelength conversion layer 353 and may then be output through the second color filter CF2. The light from the third subpixel PX3 may be output through the third wavelength conversion layer 354 and the third color filter CF3. Accordingly, white light may be output.

Also, according to the exemplary embodiment shown in FIG. 4, since the first, second, and third subpixels PX1, PX2, and PX3 are driven in a top emission manner and emit light in the direction toward the second substrate 112, a first heat dissipation film including an opaque material such as graphite or Al may be disposed on the first substrate 111.

Figure 5:
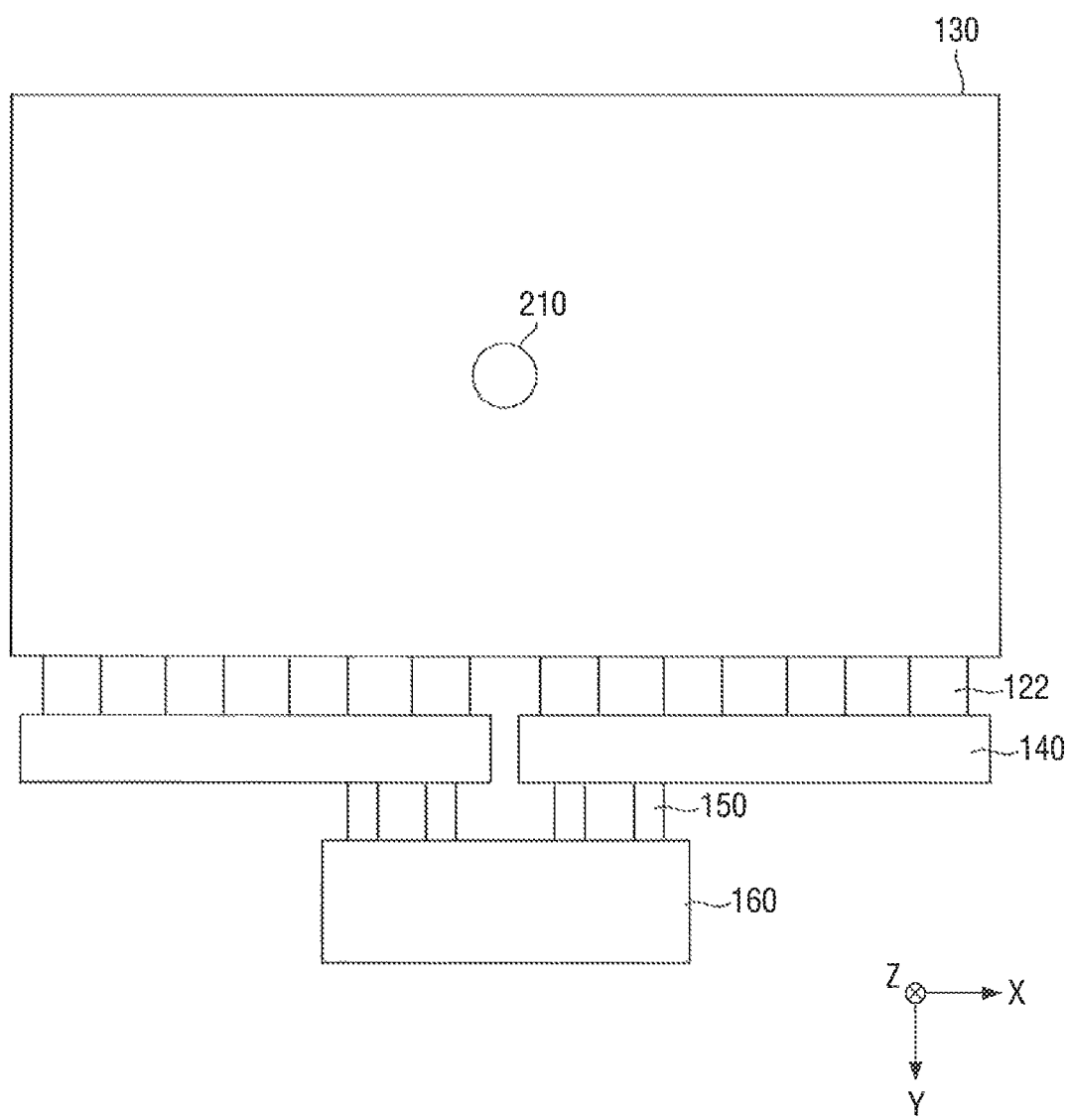
FIG. 5 is a bottom view illustrating a display device with flexible films thereof in an unbent orientation according to an exemplary embodiment of the present inventive concepts.
Figure 6:
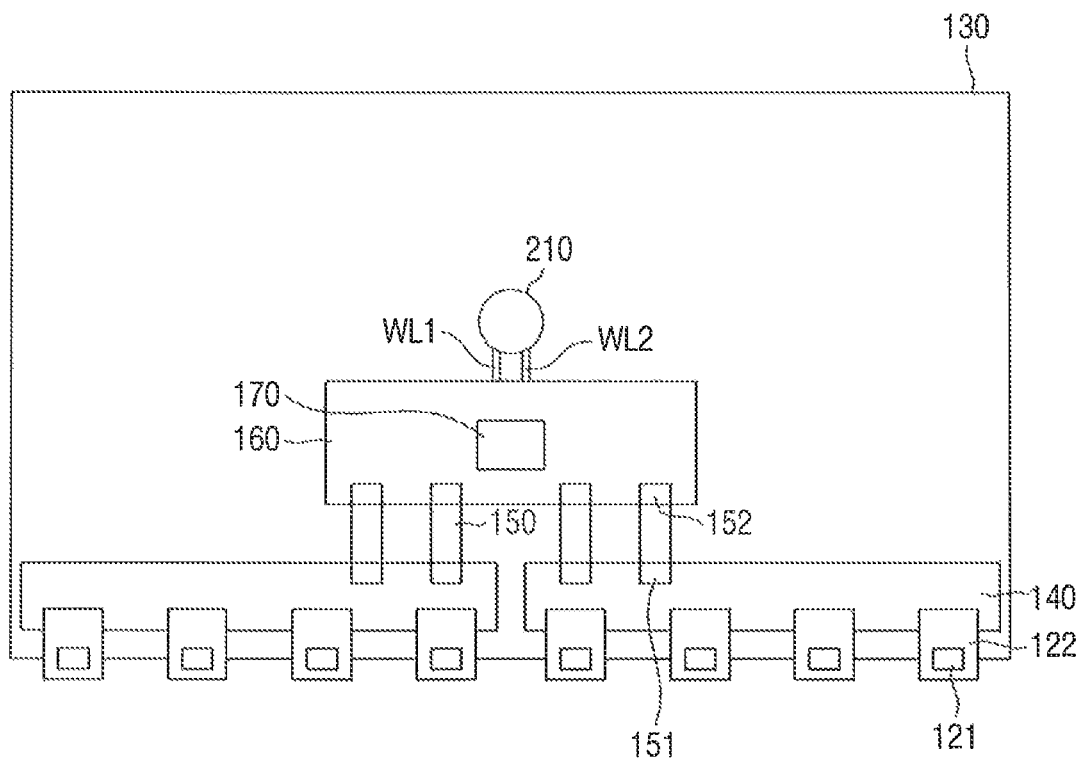
FIG. 6 is a bottom view illustrating a display device with flexible films thereof in a bent orientation according to an exemplary embodiment of the present inventive concepts.

FIG. 5 is a bottom view illustrating an exemplary display device with flexible films thereof that are not bent. FIG. 6 is a bottom view illustrating an exemplary display device with flexible films that are bent. It is noted that display devices 10 are shown reversed in FIGS. 5 and 6, which are bottom views, as compared to the display device 10 of FIGS. 1 and 2.

Referring to FIGS. 5 and 6, a first sound generator 210 may be connected to a control circuit board 160 via first and second sound wires WL1 and WL2. For example, in an embodiment in which flexible films 122 are bent toward the bottom surface of a first heat dissipation film 130, as illustrated in FIG. 6, a control circuit board 160 may be disposed on the bottom surface of the first heat dissipation film 130. The first and second sound wires WL1 and WL2 may electrically connect the control circuit board 160 and the first sound generator 210. As a result, the first sound generator 210 may be configured to receive a first driving voltage via the first sound wire WL1 and may receive a second driving voltage via the second sound wire WL2. Accordingly, the first sound generator 210 may output a first sound by causing a display panel 110 to vibrate in accordance with the first and second driving voltages.

Meanwhile, the display device 10 may further include a sound driving circuit outputting the first and second driving voltages in accordance with sound control signals, which may be digital signals input from a system-on-chip. The first and second driving voltages may be alternating current (AC) voltages that swing between a positive level and a negative level with respect to a predetermined reference level.

The sound driving circuit may be formed as an IC and may then be attached on the control circuit board 160 or a system board. The sound driving circuit may include a digital signal processor (DSP) that processes the sound control signals, which may be digital signals, a digital-to-analog converter (DAC) that converts the sound control signals processed by the DSP into the first and second driving voltages, which may be analog signals, and an amplifier (AMP) that amplifies and outputs the analog signals output by the DAC.

FIGS. 5 and 6 illustrate that the first sound generator 210 may be disposed close to the center of the display panel 110. However, exemplary embodiments of the present inventive concepts are not limited thereto.

Figure 7:
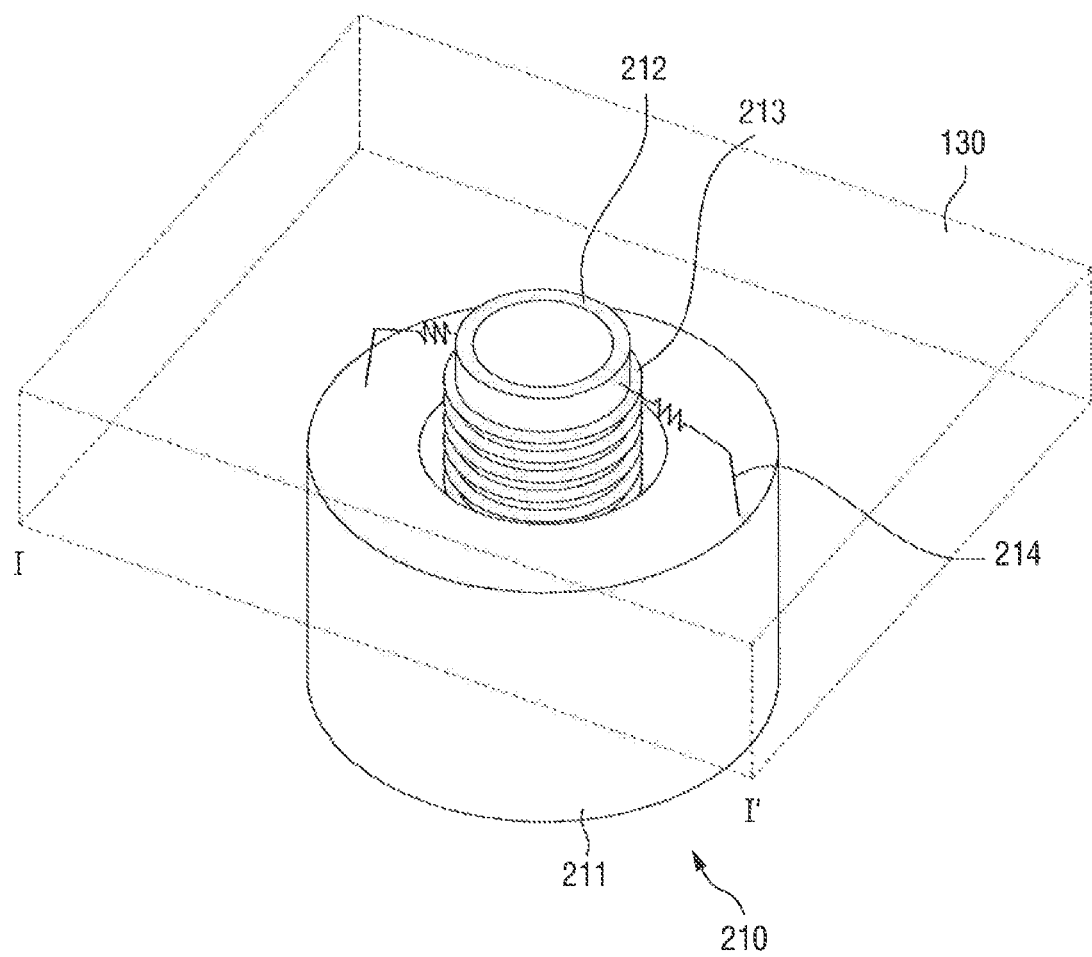
FIG. 7 is an exploded perspective view illustrating a first sound generator according to an exemplary embodiment of the present inventive concepts.
Figure 8:
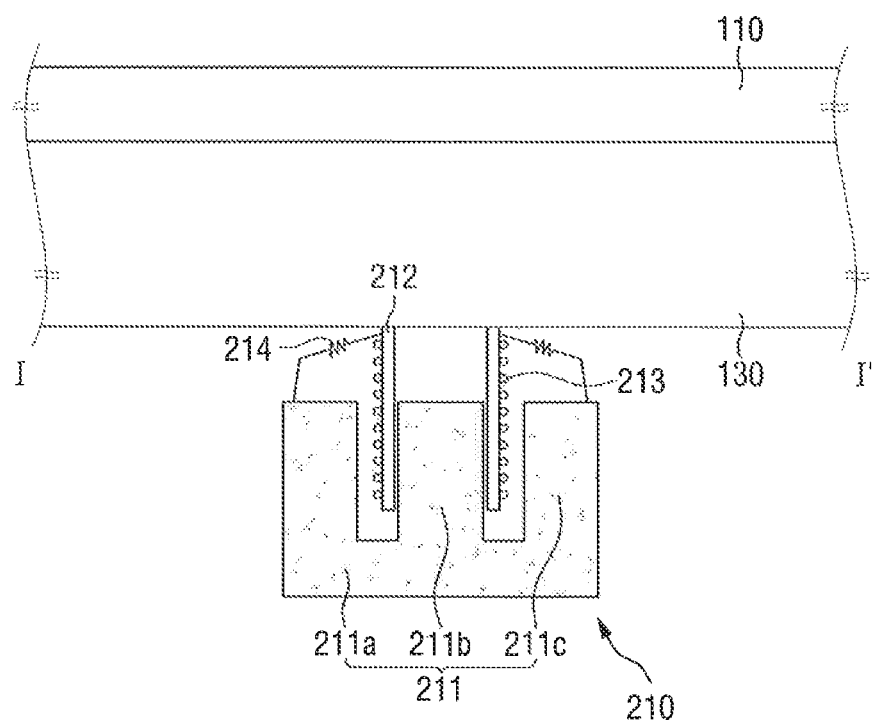
FIG. 8 is a cross-sectional view taken along line I-I' of FIG. 7 according to an exemplary embodiment of the present inventive concepts.

Referring to FIGS. 7 and 8, a first sound generator 210 may be an exciter configured to generate a magnetic force using a voice coil and thereby causes a display panel 110 to vibrate. In this embodiment, the first sound generator 210 may include a magnet 211, a bobbin 212, a voice coil 213, and dampers 214.

The magnet 211 may be a permanent magnet, and a sintered magnet such as a barium ferrite magnet may be used. In an exemplary embodiment, the magnet 211 may be formed as a ferric trioxide ($Fe_2O_3$) magnet, a barium carbonate ($BaCO_3$) magnet, a neodymium magnet, a strontium ferrite magnet with an improved magnetic component, or an Al, nickel (Ni), or cobalt (Co) cast alloy magnet. However, the exemplary embodiment of the present inventive concepts are not limited thereto. The neodymium magnet may be, for example, a neodymium-iron-boron (Nd—Fe—B) magnet.

The magnet 211 may include a plate 211a, a central protruding part 211b that protrudes from the center of the plate 211a, and a sidewall part 211c protruding from the edge of the plate. The central protruding part 211b and the sidewall part 211c may be a predetermined distance apart from each other. As a result, a predetermined space may be formed between the central protruding part 211b and the sidewall part 211c. For example, the magnet 211 may have a cylindrical shape. The magnet 211 may be in the shape of a cylinder with a circular space formed at one of the bases thereof. The plate 211a of the magnet 211 may be fixed to the lower cover 102 of FIG. 2.

The central protruding part 211b of the magnet 211 may have N-pole magnetism, and the plate 211a and the sidewall part 211c may have S-pole magnetism. As a result, an external magnetic field may be formed between the central protruding part 211b and the plate 211a of the magnet 211 and between the central protruding part and the sidewall part 211c of the magnet 211.

The bobbin 212 may be formed into a cylindrical shape. The central protruding part 211b of the magnet 211 may be disposed in the bobbin 212. The bobbin 212 may be disposed to surround the central protruding part 211b of the magnet 211. The sidewall part 211c of the magnet 211 may be disposed on the outside of the bobbin 212. For example, the sidewall part 211c of the magnet 211 may be disposed to surround the bobbin 212. Spaces may be formed between the bobbin 212 and the central protruding part 211b of the magnet 211 and between the bobbin 212 and the sidewall part 211c of the magnet 211.

In an exemplary embodiment, the bobbin 212 may be formed of a pulp-processed or paper-processed material, Al, Mg, or an alloy thereof, a synthetic resin such as polypropylene, or polyamide-based fibers. One end of the bobbin 212 may be attached to a first heat dissipation film 130 via an adhesive member. The adhesive member may be a double-sided tape.

Figure 9A:
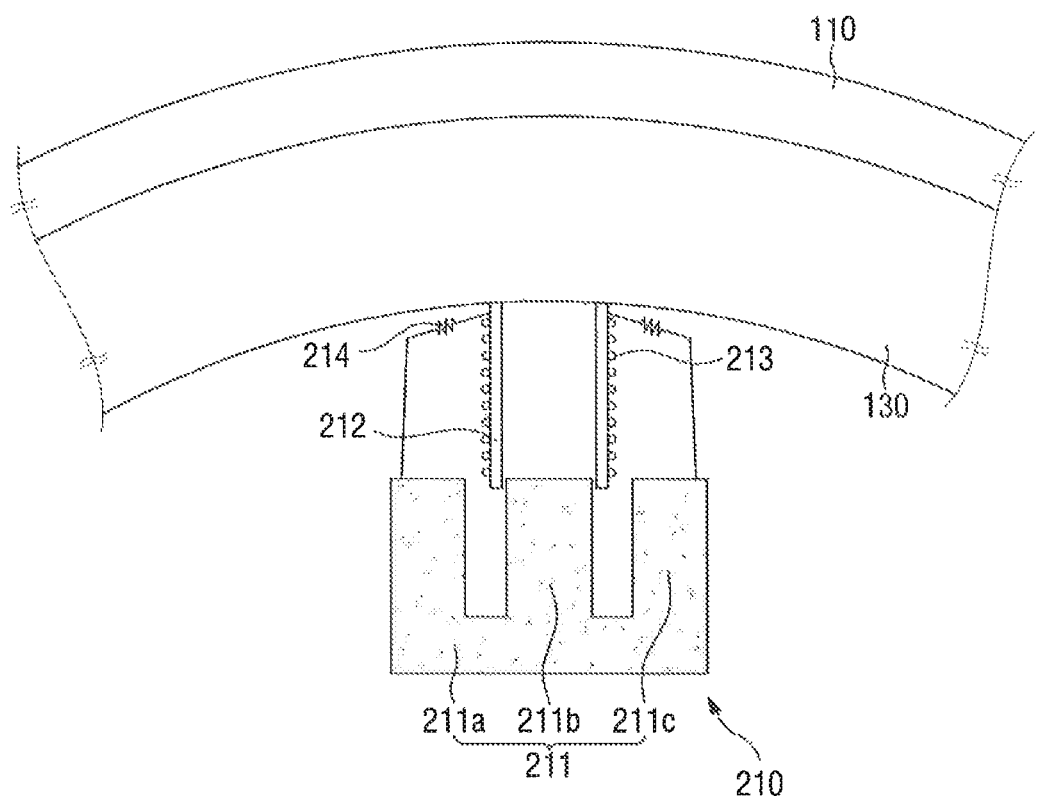
FIGS. 9A and 9B are side views illustrating the vibration of a display panel caused by the first sound generator of FIGS. 7 and 8 according to an exemplary embodiment of the present inventive concepts.
Figure 9B:
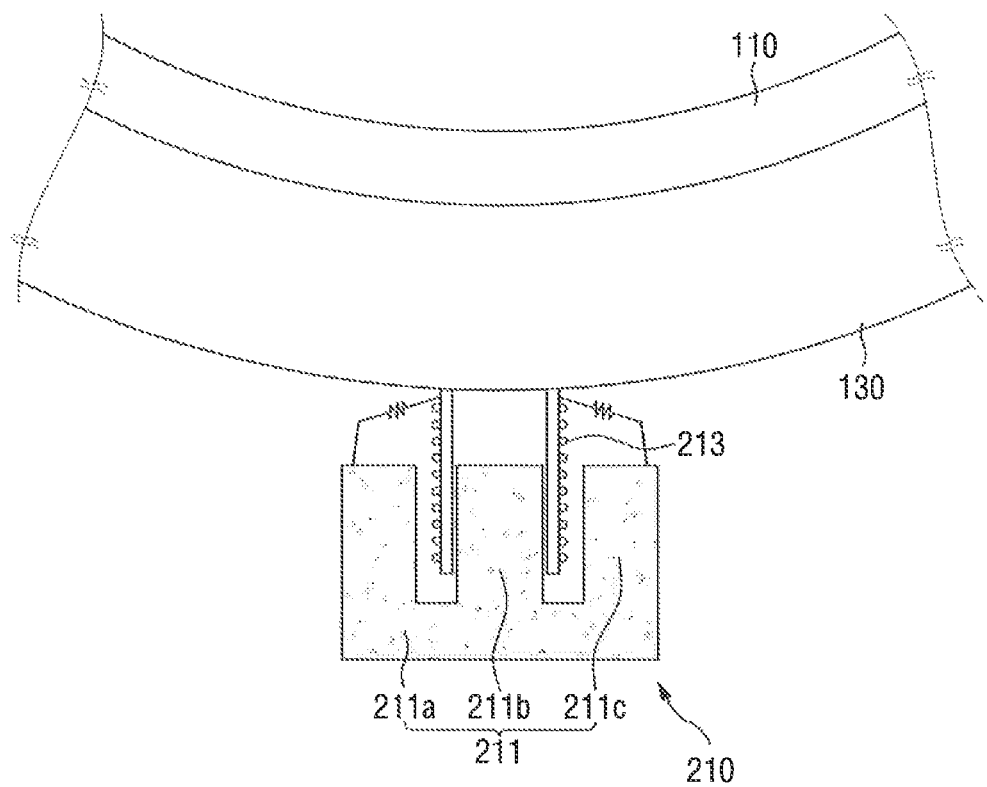

The voice coil 213 may be wound around the outer circumferential surface of the bobbin 212. One end of the voice coil 213 adjacent to one end of the bobbin 212 may be connected to a first sound wire WL1, and the other end of the voice coil 213 adjacent to the other end of the bobbin 212 may be connected to a second sound wire WL2. As a result, a current may flow in the voice coil 213 in accordance with first and second driving voltages applied to the first and second sound wires WL1 and WL2, respectively. An applied magnetic field may be formed around the voice coil 213 depending on the current that flows in the voice coil 213. For example, the direction of the current that flows in the voice coil 213 when the first driving voltage is a positive voltage and the second driving voltage is a negative voltage may be opposite to the direction of the current that flows in the voice coil 213 when the first driving voltage is a negative voltage and the second driving voltage is a positive voltage. As the first and second driving voltages are alternately driven, the N pole and the S pole of the applied magnetic field may be changed so that an attracting force and a repulsive force can be alternately acted upon the magnet 211 and the voice coil 213. Accordingly, the bobbin 212, which has the voice coil 213 wound therearound may be configured to reciprocate in a third direction (e.g., a Z-axis direction), as illustrated in FIGS. 9A and 9B. As a result, the display panel 110 and the first heat dissipation film 130 may vibrate in the third direction (e.g., the Z-axis direction), and first sound may be output.

The dampers 214 may be disposed between the top of the bobbin 212 and the sidewall part 211c of the magnet 211. The dampers 214 may contract or expand in accordance with the vertical movement of the bobbin 212 and may thus control the vertical vibration of the bobbin 212. Since the dampers 214 are connected between the bobbin 212 and the sidewall part 211c of the magnet 211, the vertical movement of the bobbin 212 (e.g., in the Z-axis direction) may be limited by the restoring force of the dampers 214. For example, when the bobbin 212 vibrates above or below a predetermined height, the bobbin bin may return to its original location due to the restoring force of the dampers 214.

Figure 10:
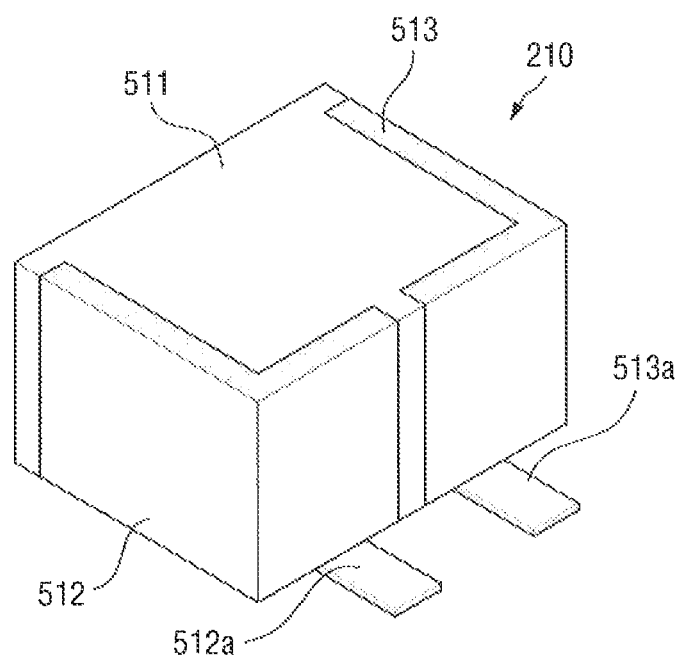
FIG. 10 is a perspective view illustrating a first sound generator according to an exemplary embodiment of the present inventive concepts.
Figure 11:
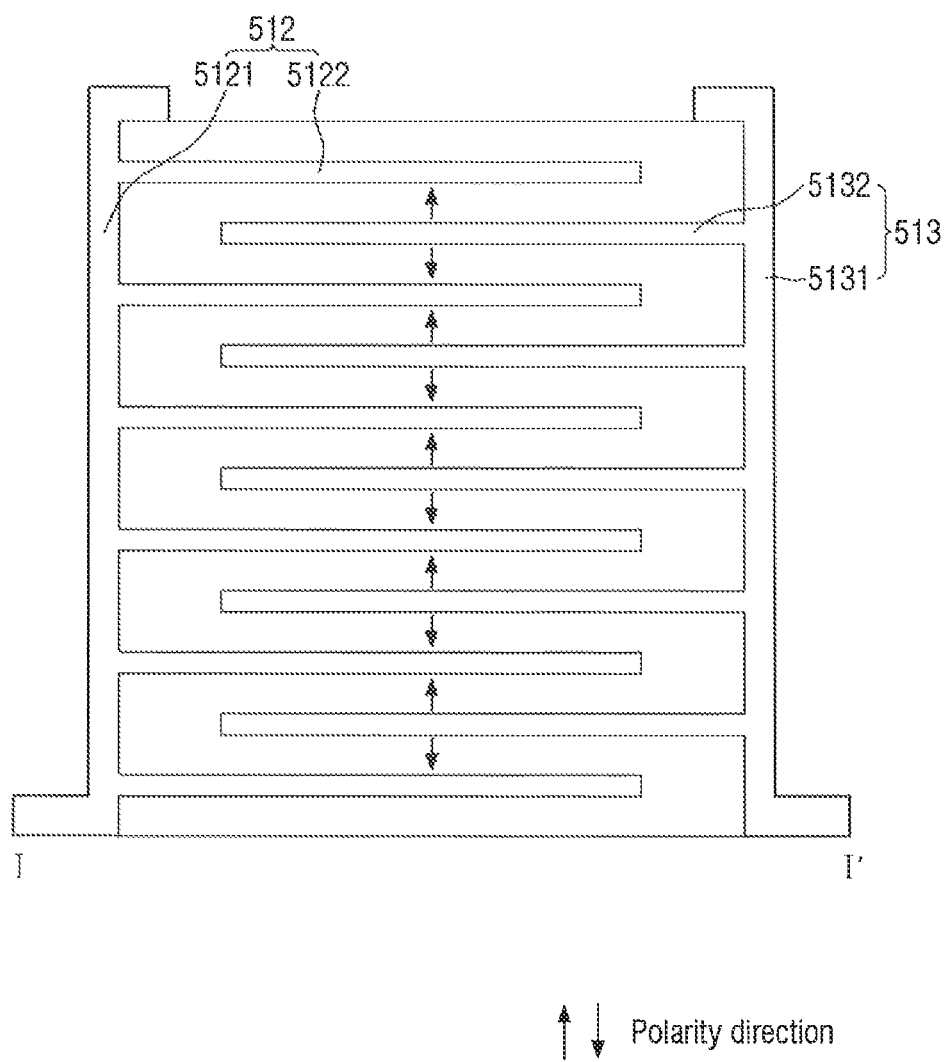
FIG. 11 is a cross-sectional view of the first sound generator of FIG. 10 according to an exemplary embodiment of the present inventive concepts.

Referring to FIGS. 10 and 11, a first sound generator 210 may be a piezoelectric element that is configured to contract or expand in accordance with a voltage applied thereto and thereby causes a display panel 110 to vibrate. In this embodiment, the first sound generator 210 may include a vibration layer 511, a first electrode 512, a second electrode 513, a first pad electrode 512a, and a second pad electrode 513a.

The first electrode 512 may include a first stem electrode 5121 and first branch electrodes 5122. The first stem electrode 5121 may be disposed on one side of the vibration layer 511 or may be disposed on more than one side of the vibration layer 511, as illustrated in FIGS. 10 and 11. The first stem electrode 5121 may be disposed on the top surface of the vibration layer 511. The first branch electrodes 5122 may be branched off from the first stem electrode 5121. The first branch electrodes 5122 may be disposed in parallel to one another.

The second electrode 513 may include a second stem electrode 5131 and second branch electrodes 5132. The second stem electrode 5131 may be disposed on one side of the vibration layer 511 or may be disposed on more than one side of the vibration layer 511, as illustrated in FIGS. 10 and 11. Referring to FIGS. 10 and 11, the first stem electrode 5121 may be disposed on one of the sides of the vibration layer 511 where the second stem electrode 5131 is not disposed. The second stem electrode 5131 may be disposed on the top surface of the vibration layer 511. The first and second stem electrodes 5121 and 5131 may not overlap with each other. The second branch electrodes 5132 may be branched off from the second stem electrode 5131. The second branch electrodes 5132 may be disposed in parallel to one another.

The first branch electrodes 5122 and the second branch electrodes 5132 may be disposed in parallel to one another in a horizontal direction (e.g., an X- or Y-axis direction). The first branch electrodes 5122 and the second branch electrodes 5132 may be alternately disposed in a vertical direction (e.g., a Z-axis direction). The first branch electrodes 5122 and the second branch electrodes 5132 may be disposed repeatedly in the order of a first branch electrode 5122, a second branch electrode 5132, a first branch electrode 5122, and a second branch electrode 5132 along the vertical direction (e.g., the Z-axis direction).

The first pad electrode 512a may be connected to the first electrode 512. The first pad electrode 512a may protrude outwardly from the first stem electrode 5121, which is disposed on one side of the vibration layer 511. The second pad electrode 513a may be connected to the second electrode 513. The second pad electrode 513a may protrude outwardly from the second stem electrode 5131, which is disposed on the other side of the vibration layer 511. The first and second pad electrodes 512a and 513a may protrude outwardly from the first and second stem electrodes 5121 and 5131 that are disposed on the same side of the vibration layer 511.

The first and second pad electrodes 512a and 513a may be connected to lead lines or pad electrodes of a first FPCB. The lead lines or the pad electrodes of the first FPCB may be disposed on the bottom surface of a first sound circuit board.

The vibration layer 511 may be a piezoelectric actuator that is deformed by first and second driving voltages applied to the first and second electrodes 512 and 513, respectively. In this embodiment, the vibration layer 511 may be one of a piezoelectric material such as a polyvinylidene difluoride (PVDF) film or lead zirconate titanate (PZT) and an electroactive polymer.

Since the vibration layer 511 is fabricated at high temperature, the first and second electrodes 512 and 513 may be formed of a metal with a high melting point such as Ag or an alloy of Ag and Pd. In a case where the first and second electrodes 512 and 513 are formed of an alloy of Ag and Pd, the Ag content of the alloy of Ag and Pd may be greater than the Pd content of the alloy of Ag and Pd to raise the melting point of the first and second electrodes 512 and 513.

The vibration layer 511 may be disposed between the first branch electrodes 5122 and the second branch electrodes 5132. The vibration layer 511 may contract or expand depending on the difference between the first driving voltage applied to the first branch electrodes 5122 and the second driving voltage applied to the second branch electrodes 5132.

As illustrated in FIG. 11, the polarity of the vibration layer 511 between the first branch electrodes 5122 and their respective underlying second branch electrodes 5132 may have an upward direction (↑). In this case, the vibration layer 511 may have a positive polarity in upper parts thereof adjacent to the first branch electrodes 5122 and a negative polarity in lower parts thereof adjacent to the second branch electrodes 5132. Alternatively, the polarity of the vibration layer 511 between the second branch electrodes 5132 and their respective underlying first branch electrodes 5122 may have a downward direction (↓). In this case, the vibration layer 511 may have a negative polarity in the upper parts thereof adjacent to the first branch electrodes 5122 and a positive polarity in the lower parts thereof adjacent to the second branch electrodes 5132. The direction of the polarity of the vibration layer 511 may be determined by a poling process for applying an electric field to the vibration layer 511 using the first branch electrodes 5122 and the second branch electrodes 5132.

Figure 12:
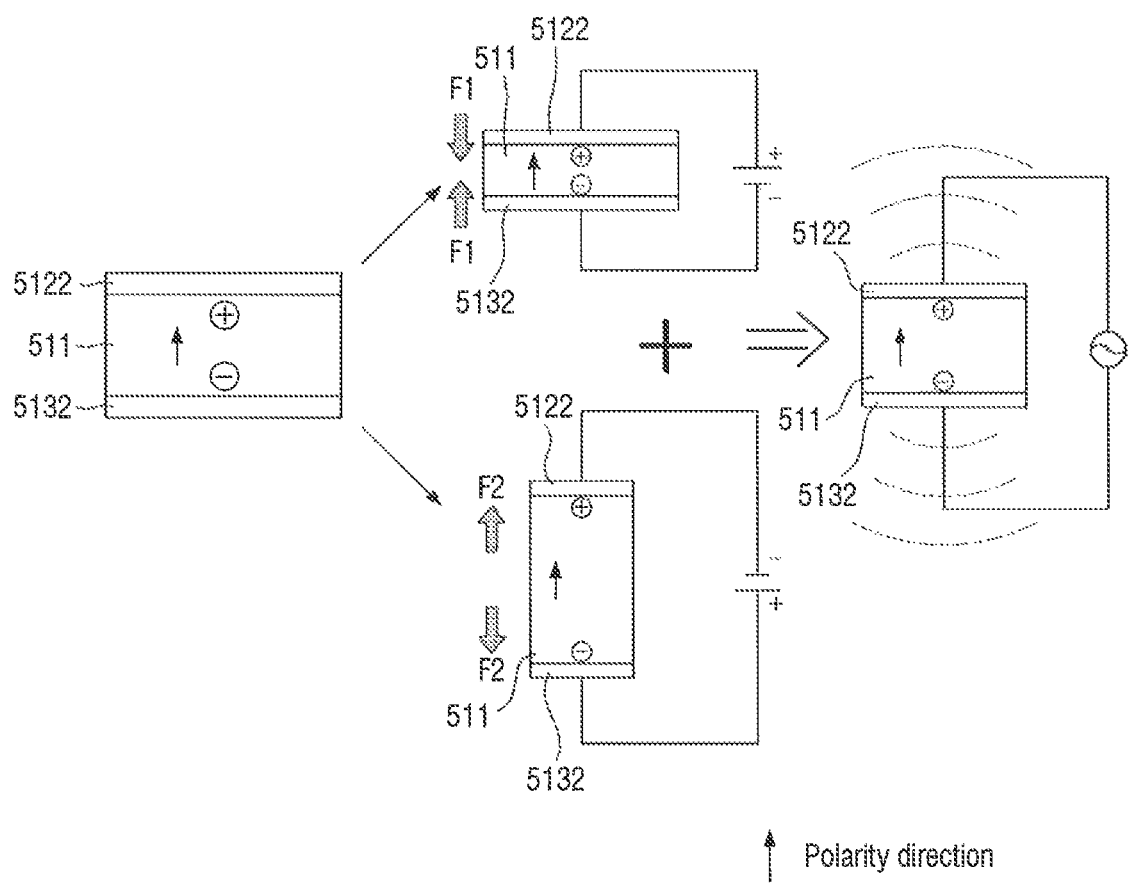
FIG. 12 is a schematic view illustrating the vibration of a vibration layer disposed between first branch electrodes and second branch electrodes of the first sound generator of FIGS. 10 and 11 according to an exemplary embodiment of the present inventive concepts.

When the direction of the polarity of the vibration layer 511 between the first branch electrodes 5122 and their respective underlying second branch electrodes 5132 is the upward direction (↑), as illustrated in FIG. 12, the vibration layer 511 may contract in accordance with a first force F1 in response to a positive first driving voltage and a negative second driving voltage being applied to the first branch electrodes 5122 and the second branch electrodes 5132, respectively. The first force F1 may be a contraction force. On the other hand, in response to a negative first driving voltage and a positive second driving voltage being applied to the first branch electrodes 5122 and the second branch electrodes 5132, respectively, the vibration layer 511 may expand in accordance with a second force F2. The second force F2 may be an extension force.

When the direction of the polarity of the vibration layer 511 between the second branch electrodes 5132 and their respective underlying first branch electrodes 5122 is the downward direction (↓), the vibration layer 511 may expand in accordance with an extension force in response to a positive first driving voltage and a negative second driving voltage being applied to the first branch electrodes 5122 and the second branch electrodes 5132, respectively. On the other hand, in response to a negative first driving voltage and a positive second driving voltage being applied to the first branch electrodes 5122 and the second branch electrodes 5132, respectively, the vibration layer 511 may contract in accordance with a contraction force. The second force F2 may be an extension force.

According to the embodiment of FIGS. 10 and 11, in a case where the first and second driving voltages applied to the first and second electrodes 512 and 513, respectively, alternately change from a positive polarity to a negative polarity, the vibration layer 511 repeatedly contracts and expands. As a result, the first sound generator 210 vibrates.

Figure 13B:
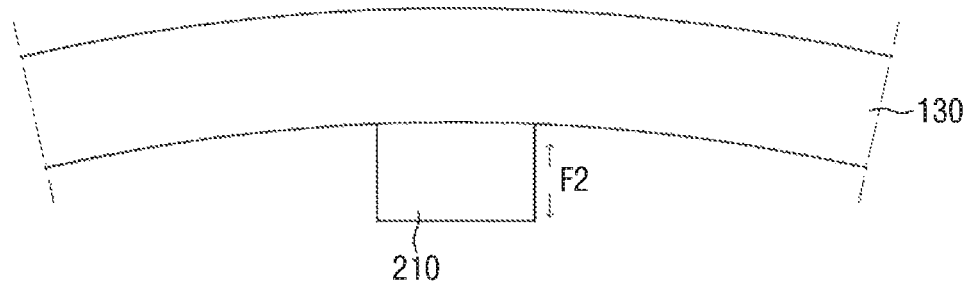

Since the first sound generator 210 is disposed on the bottom surface of the display panel 110, the display panel 110 may vibrate vertically due to stress, as illustrated in FIGS. 13A and 13B, as the vibration layer 511 of the first sound generator 210 contracts and expands. Since the first sound generator 210 causes the display panel 110 to vibrate, the display device 10 may be configured to output sound.

Figure 14:
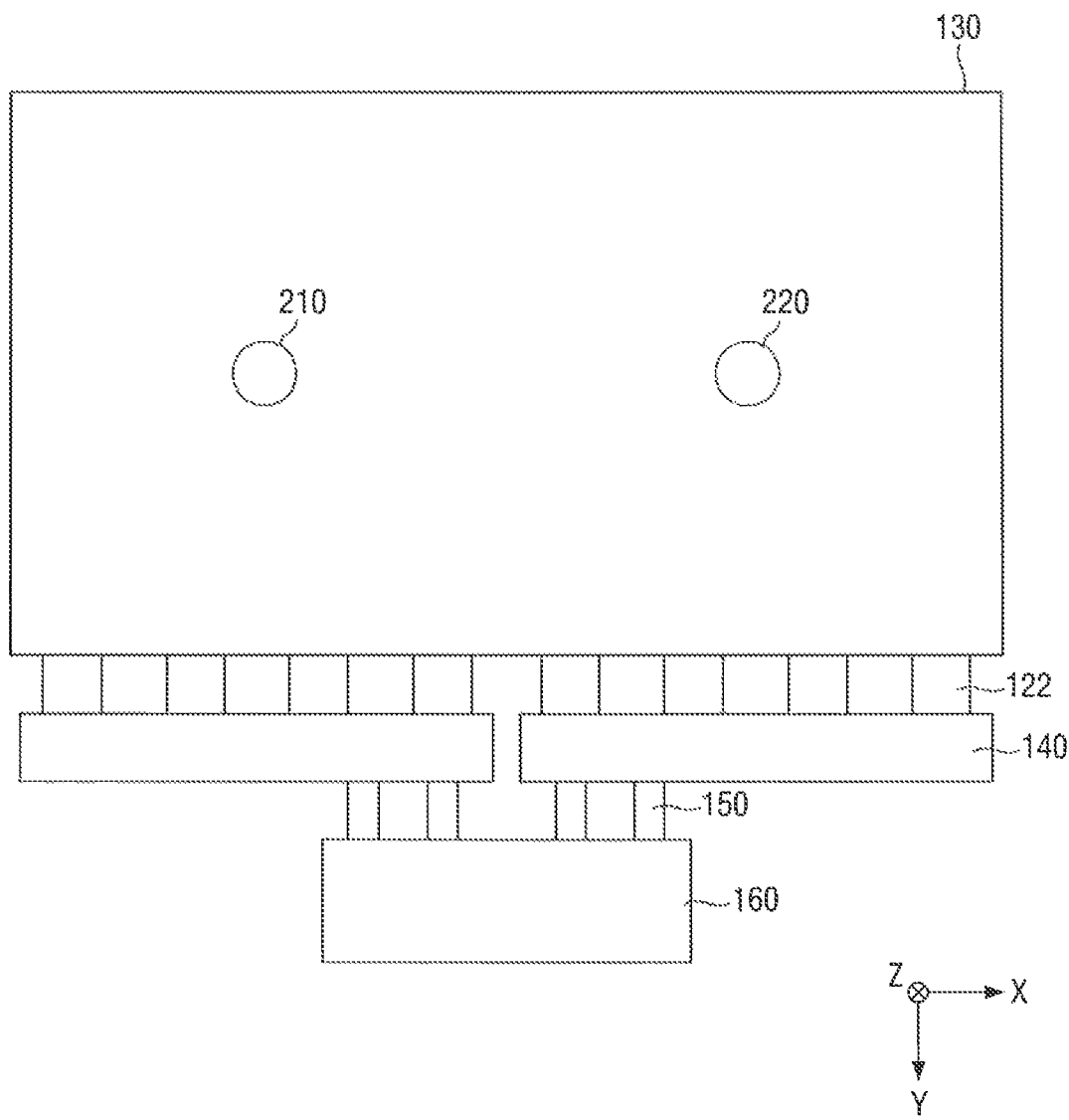
FIG. 14 is a bottom view of a display device according to another exemplary embodiment of the present inventive concepts.

FIG. 14 is a bottom view of a display device according to another exemplary embodiment of the present disclosure. It is noted that a display device 10 is shown reversed in FIG. 14, which is a bottom view, as compared to the display device 10 of FIGS. 1 and 2.

The embodiment of FIG. 14 differs from the embodiments of FIGS. 1 through 6 in that the display device 10 includes two sound generators (210 and 220). The embodiment of FIG. 14 will hereinafter be described, focusing mainly on the difference(s) with the embodiments of FIGS. 1 through 6.

Figure 19:
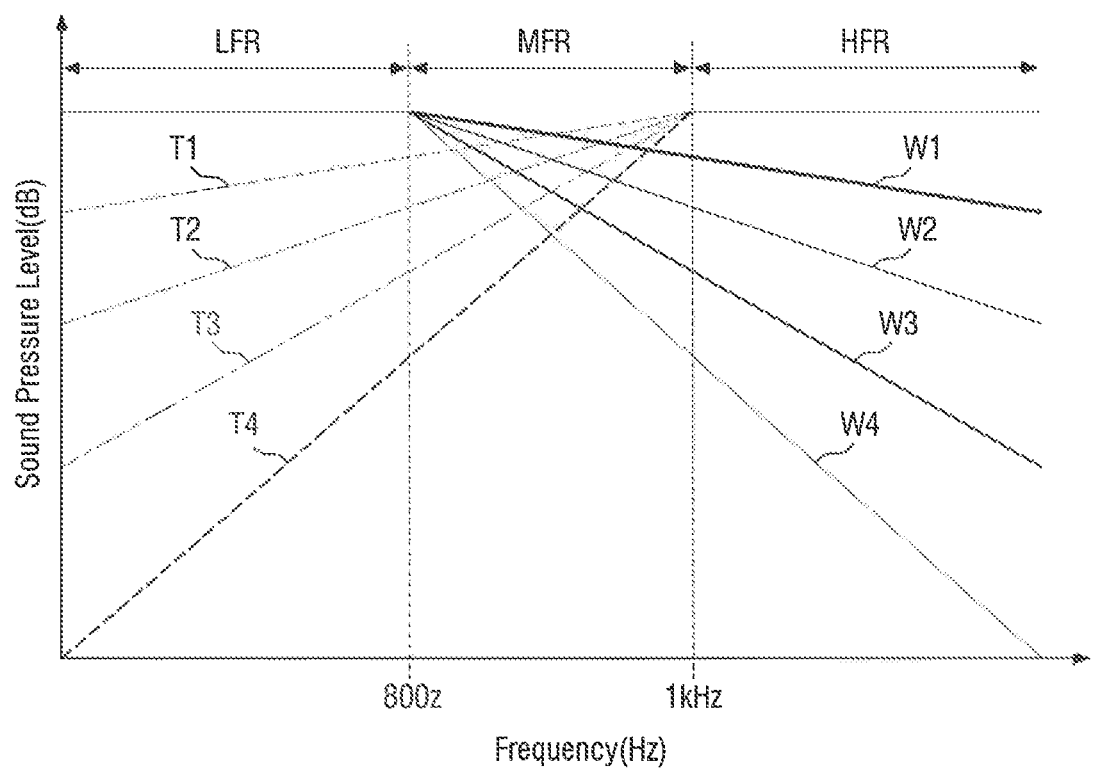
FIG. 19 is a graph showing the sound pressure levels, at each frequency, of sound generated by sound generators according to an exemplary embodiment of the present inventive concepts.

Referring to FIG. 14, first and second sound generators 210 and 220 may be exciters that are configured to generate a magnetic force using a voice coil which causes a display panel 110 to vibrate, as illustrated in FIGS. 7 and 8. The first and second sound generators 210, 220 may also be piezoelectric elements contracting and expanding in accordance with a voltage applied thereto and thereby causing the display panel 110 to vibrate, as illustrated in FIGS. 10 and 11. The first and second sound generators 210 and 220 may both serve as tweeters for outputting sound having a high sound pressure level in a high-frequency range. The high-frequency range may be a range of frequencies of 1 kHz or higher, as illustrated in FIG. 19.

In an exemplary embodiment, the first sound generator 210 may be disposed adjacent to the right side of the display panel 110, and the second sound generator 220 may be disposed adjacent to the left side of the display panel 110. Accordingly, the first sound generator 210 may be configured to output a first sound to the right front of the display panel 110, and the second sound generator 220 may be configured to output a second sound to the left front of the display panel 110. Therefore, the display device 10 may provide stereo sound of 2.0 channels to a user.

The fundamental zero (F0) of each of the first and second sound generators 210 and 220 may be 1 kHz or higher. Here, F0 denotes the minimum frequency at which the displacement of vibration of the display panel 110 exceeds a reference displacement level due to each sound generator. If the displacement of vibration of the display panel 110 exceeds the reference displacement level due to each sound generator, the sound pressure level of each sound generator may become higher than a reference sound pressure level.

The sound output characteristics of the first sound generator 210 and the sound output characteristics of the second sound generator 220 may be substantially the same. For example, the F0 of the first sound generator 210 and the F0 of the second sound generator 220 may be substantially the same, and the sound pressure level, at each frequency, of the first sound generator 210 and the sound pressure level, at each frequency, of the second sound generator 220 may be one of T1, T2, T3, and T4 of FIG. 19. Referring to FIG. 19, T1, T2, T3, and T4 may all have a F0 in a high-frequency range HFR but have different sound pressure levels in a low-frequency range LFR. The sound pressure level in the low-frequency range LFR may gradually decrease from T1 to T4. In an embodiment where the display device 10 provides stereo sound of 2.0 channels to the user using the first and second sound generators 210 and 220, the sound pressure level, at each frequency, of the first sound generator 210 and the sound pressure level, at each frequency, of the second sound generator 220 may preferably be T1 or T2, which has a high sound pressure level even in the low-frequency range LFR, because there is no woofer for outputting low-pitched sound.

Alternatively, the sound output characteristics of the first sound generator 210 may be different from the sound output characteristics of the second sound generator 220. For example, the sound pressure level, at each frequency, of the first sound generator 210 may be different from the sound pressure level, at each frequency, of the second sound generator 220. Specifically, if the sound pressure level, at each frequency, of the first sound generator 210 is one of T1, T2, T3, and T4 of FIG. 19, the sound pressure level, at each frequency, of the second sound generator 220 may be another one of T1, T2, T3, and T4 of FIG. 19.

For example, the F0 of the first sound generator 210 may be different from the F0 of the second sound generator 220. In an exemplary embodiment, the F0 of the first sound generator 210 may be higher than the F0 of the second sound generator 220. In an embodiment where the first and second sound generators 210 and 220 are exciters generating a magnetic force using a voice coil and thereby causing the display panel 110 to vibrate, the F0 of each of the first and second sound generators 210 and 220 may decrease as the diameter of the bobbin 212 of each of the first and second sound generators 210 and 220 increases. Thus, the diameter of the bobbin 212 of the first sound generator 210 may be smaller than the diameter of the bobbin 212 of the second sound generator 220. In an embodiment where the first and second sound generators 210 and 220 are piezoelectric elements contracting and expanding in accordance with a voltage applied thereto and thereby causing the display panel 110 to vibrate, the F0 of each of the first and second sound generators 210 and 220 may decrease as the area of the vibration layer 511 of each of the first and second sound generators 210 and 220 increases. Accordingly, the area of the vibration layer 511 of the first sound generator 210 may be smaller than the area of the vibration layer 511 of the second sound generator 220.

In the embodiment of FIG. 14, the first sound generator 210 may be disposed adjacent to one side of the display panel 110, the second sound generator 220 may be disposed adjacent to the other side of the display panel 110, and sound having a high sound pressure level in a high-frequency range is output using the first and second sound generators 210 and 220. Therefore, the display device 10 may provide stereo sound of 2.0 channels to the user.

Figure 15:
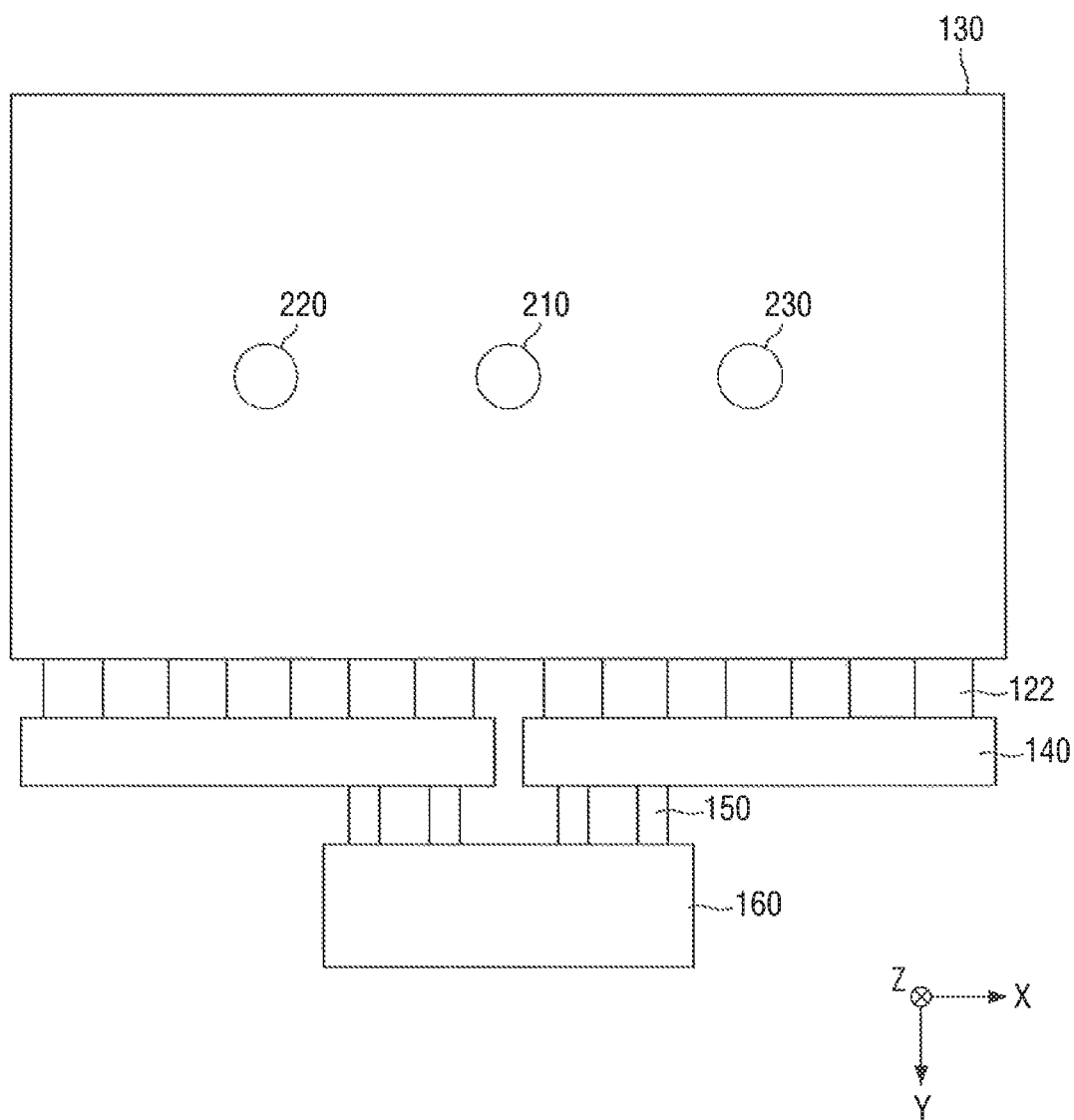
FIG. 15 is a bottom view of a display device according to another exemplary embodiment of the present inventive concepts.

FIG. 15 is a bottom view of a display device according to another exemplary embodiment of the present disclosure. It is noted that a display device 10 is shown reversed in FIG. 15, which is a bottom view, as compared to the display device 10 of FIGS. 1 and 2.

The embodiment of FIG. 15 differs from the embodiments of FIGS. 1 through 6 in that the display device 10 includes three sound generators (210, 220, and 230). The embodiment of FIG. 15 will hereinafter be described, focusing mainly on the difference(s) with the embodiments of FIGS. 1 through 6.

Referring to FIG. 15, first, second, and third sound generators 210, 220, and 230 may be exciters that are configured to generate a magnetic force using a voice coil and thereby causes a display panel 110 to vibrate, as illustrated in FIGS. 7 and 8. The first, second and third sound generators may also be piezoelectric elements contracting and expanding in accordance with a voltage applied thereto and thereby causing the display panel 110 to vibrate, as illustrated in FIGS. 10 and 11. In this embodiment, the first, second, and third sound generators 210, 220, and 230 may all serve as tweeters for outputting sound having a high sound pressure level in a high-frequency range. The high-frequency range may be a range of frequencies of 1 kHz or higher, as illustrated in FIG. 19.

The first sound generator 210 may be disposed adjacent to the center of the display panel 110, the second sound generator 220 may be disposed adjacent to the right side of the display panel 110, the third sound generator 230 may be disposed adjacent to the left side of the display panel 110. Accordingly, the first sound generator 210 may be configured to output a first sound to the central front of the display panel 110, the second sound generator 220 may be configured to output a second sound to the right front of the display panel 110, and the third sound generator 230 may be configured to output a third sound to the left front of the display panel 110. Therefore, the display device 10 may be configured to provide stereo sound of 3.0 channels to a user.

The F0 of each of the first, second, and third sound generators 210, 220, and 230 may be 1 kHz or higher. The sound pressure level at each respective frequency of the first sound generator 210, the second sound generator 220, and the third sound generator 230 may all be substantially the same. For example, the F0 of the first sound generator 210, the F0 of the second sound generator 220, and the F0 of the third sound generator 230 may all be substantially the same, and the sound pressure level, at each respective frequency, of the first sound generator 210, the second sound generator 220, and the third sound generator 230 may be one of T1, T2, T3, and T4 of FIG. 19. In an embodiment where the display device 10 is configured to provide stereo sound of 3.0 channels to the user using the first, second, and third sound generators 210, 220, and 230, the sound pressure level, at each frequency, of the first sound generator 210, the second sound generator 220 and the third sound generator 230 may preferably be T1 or T2, which has a high sound pressure level even in the low-frequency range LFR, because there is no woofer for outputting low-pitched sound.

Alternatively, the sound output characteristics of the first sound generator 210, the sound output characteristics of the second sound generator 220, and the sound output characteristics of the third sound generator 230 may differ. For example, the sound pressure level, at each respective frequency, of the first sound generator 210, the second sound generator 220, and the third sound generator 230 may differ. If the sound pressure level, at each frequency, of the first sound generator 210, which is disposed adjacent to the center of the display panel 110, is one of T1, T2, T3, and T4 of FIG. 19, the sound pressure level, at each frequency, of the second sound generator 220 may be another one of T1, T2, T3, and T4 of FIG. 19, and the sound pressure level, at each frequency, of the third sound generator 230 may be yet another one of T1, T2, T3, and T4 of FIG. 19. In another example, the sound pressure level, at each respective frequency, of the first sound generator 210, the second sound generator 220, and the third sound generator 230 may all differ.

For example, the F0 of the first sound generator 210 may be different from the F0 of the second sound generator 220. The F0 of the first sound generator 210, which is disposed adjacent to the center of the display panel 110, may be higher than the F0 of each of the second and third sound generators 220 and 230. In an embodiment where the first, second, and third sound generators 210, 220, and 230 are exciters configured to generate a magnetic force using a voice coil and thereby causing the display panel 110 to vibrate, the F0 of each of the first, second, and third sound generators 210, 220, and 230 decreases as the diameter of the bobbin 212 of each of the first, second, and third sound generators 210, 220, and 230 increases. Thus, the diameter of the bobbin 212 of the first sound generator 210 may be smaller than the diameter of the bobbin 212 of each of the second and third sound generators 220 and 230. In an embodiment where the first, second, and third sound generators 210, 220, and 230 are piezoelectric elements contracting and expanding in accordance with a voltage applied thereto and thereby causing the display panel 110 to vibrate, the F0 of each of the first, second, and third sound generators 210, 220, and 230 decreases as the area of the vibration layer 511 of each of the first, second, and third sound generators 210, 220, and 230 increases. Accordingly, the area of the vibration layer 511 of the first sound generator 210 may be smaller than the area of the vibration layer 511 of each of the second and third sound generators 220 and 230.

In the embodiment of FIG. 15, the first sound generator 210 may be disposed adjacent to the center of the display panel 110, the second sound generator 220 may be disposed adjacent to one side of the display panel 110, the third sound generator 230 may be disposed adjacent to the other side of the display panel 110. Sound having a high sound pressure level in a high-frequency range may be output using the first, second, and third sound generators 210, 220, and 230. Therefore, the display device 10 may provide stereo sound of 3.0 channels to the user.

Figure 16A:
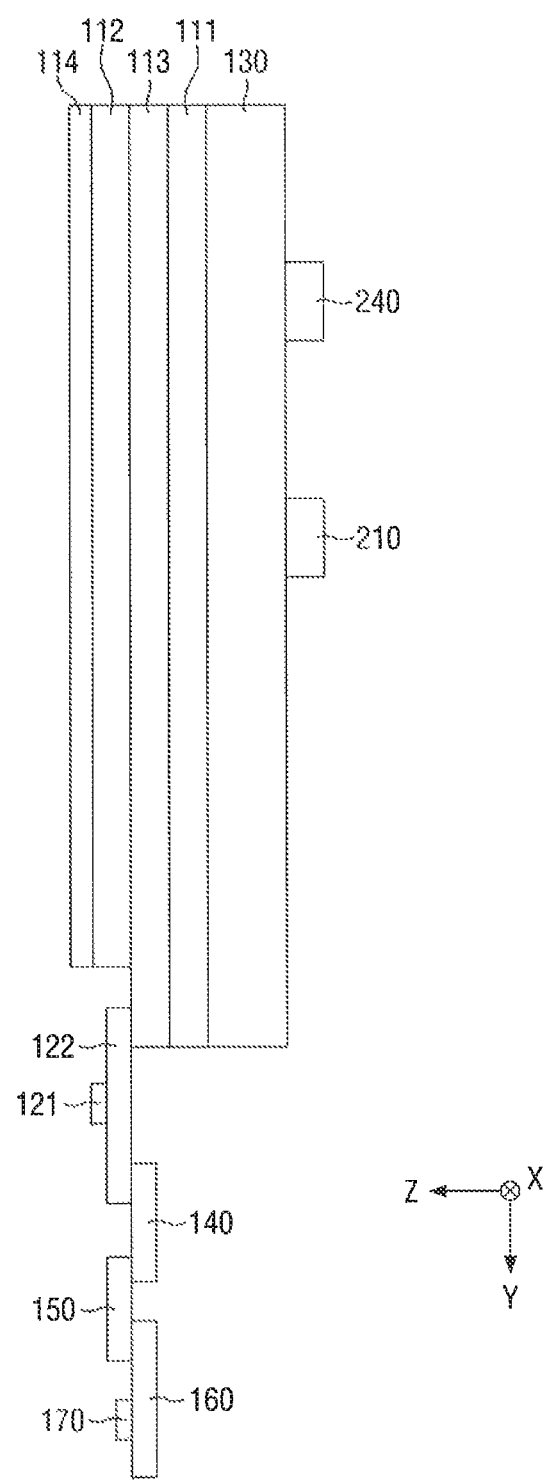
FIGS. 16A and 16B are a side view and a bottom view, respectively, of a display device according to another exemplary embodiment of the present inventive concepts.
Figure 16B:
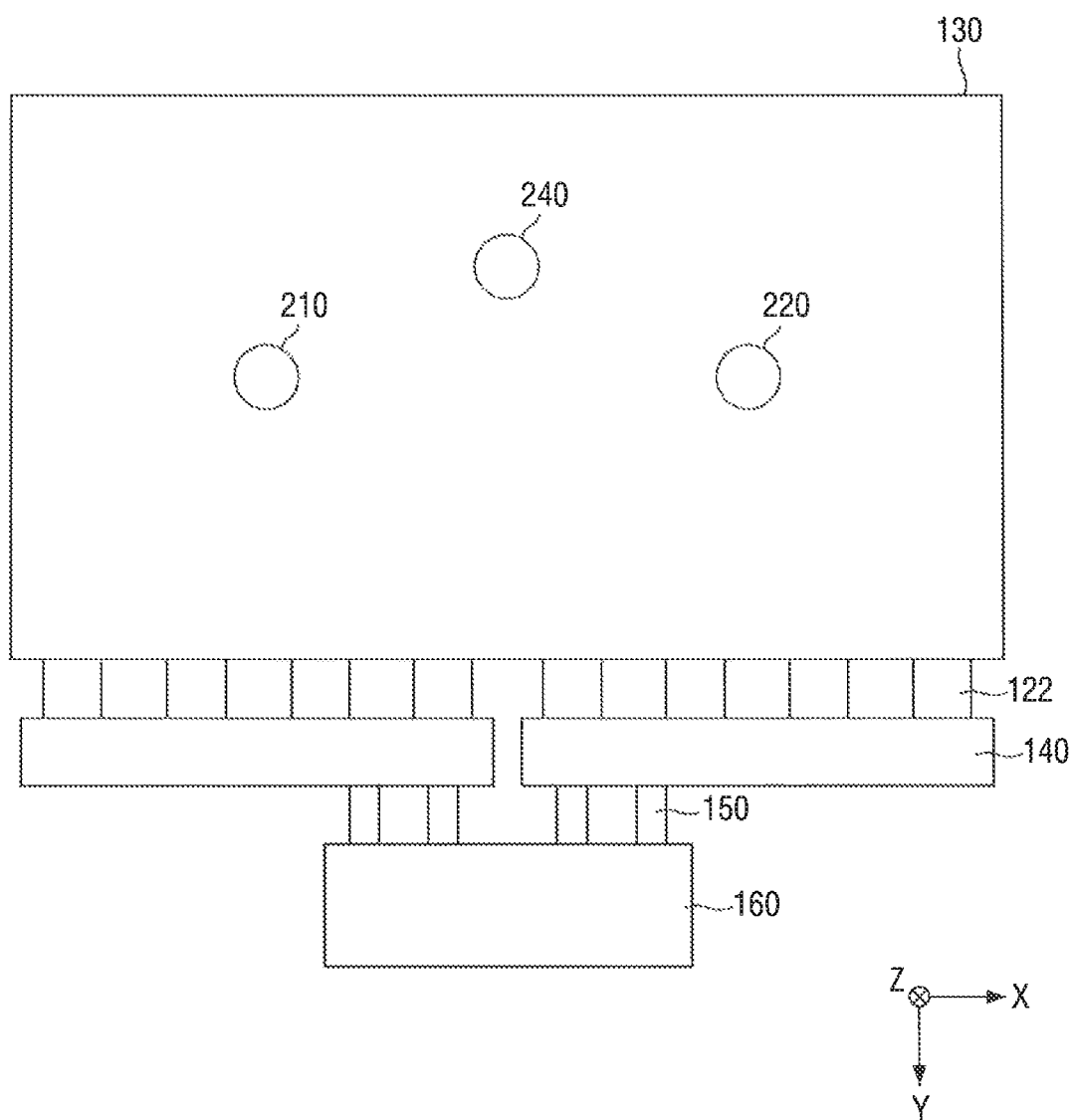

FIGS. 16A and 16B are a side view and a bottom view, respectively, of a display device according to another exemplary embodiment of the present disclosure. It is noted that a display device 10 is shown reversed in each of FIGS. 16A and 16B, which are bottom views, as compared to the display device 10 of FIGS. 1 and 2.

The exemplary embodiment of FIGS. 16A and 16B differ from the embodiments of FIGS. 1 through 6 in that the display device 10 includes three sound generators (210, 220, and 240). The exemplary embodiment of FIGS. 16A and 16B will hereinafter be described, focusing mainly on the difference(s) with the embodiments of FIGS. 1 through 6.

Referring to FIGS. 16A and 16B, first and second sound generators 210 and 220 may be exciters configured to generate a magnetic force using a voice coil and thereby causing a display panel 110 to vibrate, as illustrated in FIGS. 7 and 8. The first and second sound generators may alternatively be piezoelectric elements that are configured to contract and expand in accordance with a voltage applied thereto and thereby causing the display panel 110 to vibrate, as illustrated in FIGS. 10 and 11. A fourth sound generator 240 may be an exciter configured to generate a magnetic force using a voice coil and thereby causing the display panel 110 to vibrate, as illustrated in FIGS. 7 and 8, the fourth sound generator 240 may alternatively be a linear resonant actuator (LRA) or an eccentric rotating mass (ERM) generating a magnetic force using a voice coil and thereby causing the display panel 110 to vibrate, as illustrated in FIG. 17.

In an embodiment where the fourth sound generator 240 is an exciter configured to generate a magnetic force using a voice coil and thereby causing the display panel 110 to vibrate, as illustrated in FIGS. 7 and 8, the F0 of each of the first, second, and fourth sound generators 210, 220, and 240 may decrease as the diameter of the bobbin 212 of each of the first, second, and fourth sound generators 210, 220, and 240 increases. Thus, the diameter of the bobbin 212 of the fourth sound generator 240 may be greater than the diameter of the bobbin 212 of each of the first and second sound generators 210 and 220.

Figure 17:
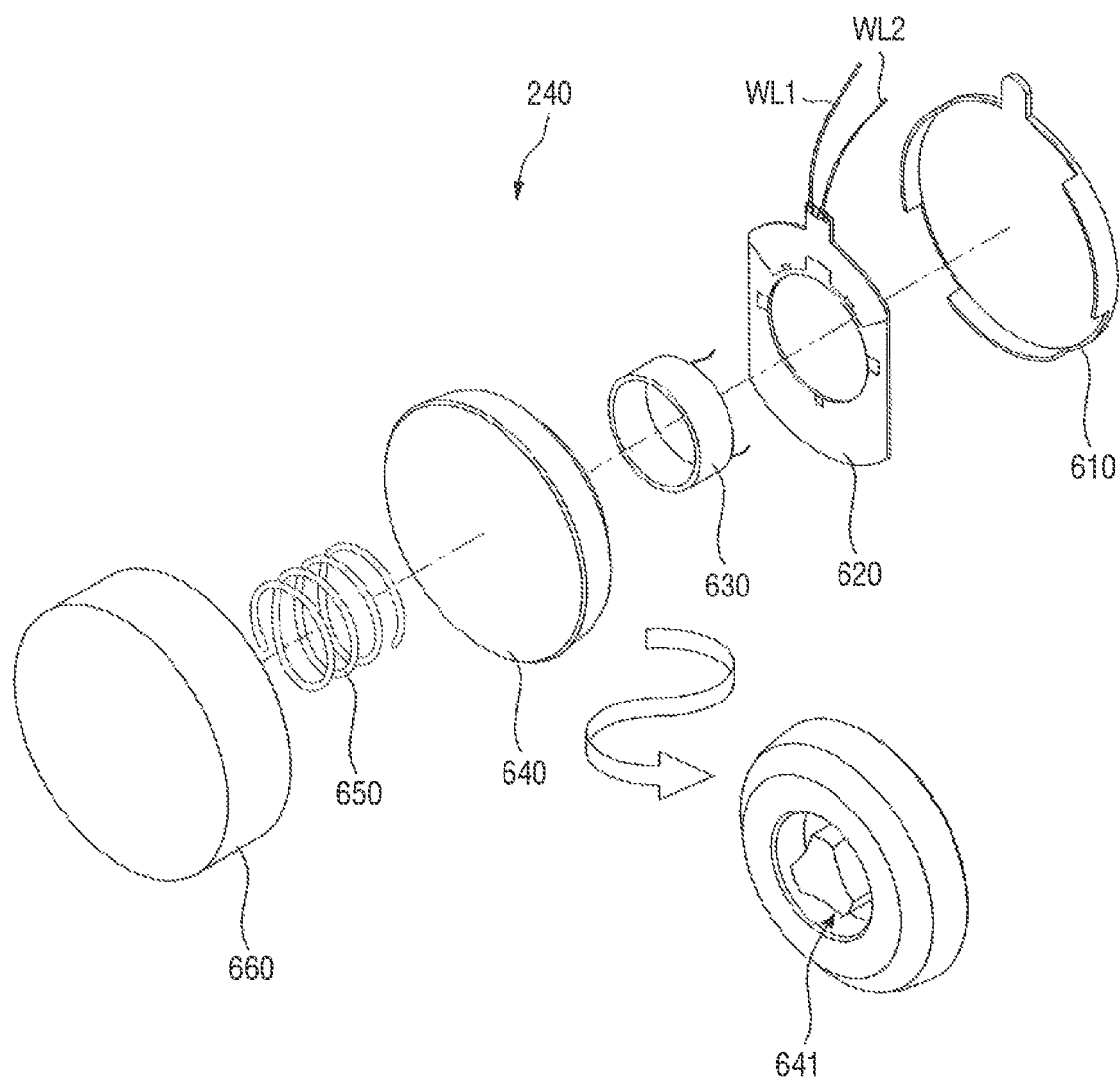
FIG. 17 is an exploded perspective view illustrating a fourth sound generator according to an exemplary embodiment of the present inventive concepts.

In an embodiment where the fourth sound generator 240 is an LRA, as illustrated in FIG. 17, the fourth sound generator 240 may include a lower chassis 610, an FPCB 620, a voice coil 630, a magnet 640, a spring 650, and an upper chassis 660. The lower and upper chassis 610 and 660 may be formed of a metal material. The FPCB 620 may be disposed on a surface of the lower chassis 610 that faces the upper chassis 660 and may be connected to first and second sound wires WL1 and WL2. The voice coil 630 may be connected to a surface of the FPCB 620 that faces the upper chassis 660. Accordingly, one end of the voice coil 630 may be electrically connected to the first sound wire WL1, and the other end of the voice coil 630 may be electrically connected to the second sound wire WL2. In an exemplary embodiment, the magnet 640 may be a permanent magnet, and a voice coil groove 641, in which the voice coil 630 is received, may be formed on a surface of the magnet 640 that faces the voice coil 630. A spring 650 may be disposed between the magnet 640 and the upper chassis 660.

The direction of a current that flows in the voice coil 630 of the fourth sound generator 240 may be controlled in accordance with first and second driving voltages applied to the first and second sound wires WL1 and WL2. An applied magnetic field may be formed around the voice coil 630 depending on the current that flows in the voice coil 630. For example, the direction of the current that flows in the voice coil 630 when the first driving voltage is a positive voltage and the second driving voltage is a negative voltage may be opposite to the direction of the current that flows in the voice coil 630 when the first driving voltage is a negative voltage and the second driving voltage is a positive voltage. As the first and second driving voltages are alternately driven, an attracting force and a repulsive force may be acted upon the magnet 640 and the voice coil 630 so that the magnet 640 may be configured to reciprocate between the voice coil 630 and the upper chassis 660 due to the spring 650. As a result, the vibration surface disposed on the upper chassis 660 may be configured to vibrate, and a fourth sound may be output.

The first and second sound generators 210 and 220 may serve as tweeters for outputting sound having a high sound pressure level in a high-frequency range. On the other hand, the fourth sound generator 240 may serve as a woofer for outputting sound having a high sound pressure level in a low-frequency range. The high-frequency range may be a range of frequencies of 1 kHz or higher, and the low-frequency range may be a range of frequencies of 800 Hz or lower, as illustrated in FIG. 19.

The first sound generator 210 may be disposed adjacent to the right side of the display panel 110, and the second sound generator 220 may be disposed adjacent to the left side of the display panel 110. FIGS. 16A and 16B illustrate that the fourth sound generator 240 may be disposed adjacent to the upper side of the display panel 110, but the location of the fourth sound generator 240 may not be particularly limited because the fourth sound generator 240 serves as a woofer with a relatively lower sound directivity than a tweeter. Accordingly, the first sound generator 210 may be configured to output first sound to the right front of the display panel 110. The second sound generator 220 may be configured to output second sound to the left front of the display panel 110. The fourth sound generator 240 may be configured to output a low-pitched fourth sound. Therefore, the display device 10 may provide stereo sound of 2.1 channels to a user.

The F0 of each of the first and second sound generators 210 and 220 may be 1 kHz or higher. The F0 of the fourth sound generator 240 may be 800 Hz or lower, preferably, 400 Hz or lower.

The sound output characteristics of the first sound generator 210 and the sound output characteristics of the second sound generator 220 may be substantially the same. For example, the F0 of the first sound generator 210 and the F0 of the second sound generator 220 may be substantially the same, and the sound pressure level, at each frequency, of the first sound generator 210 and the sound pressure level, at each frequency, of the second sound generator 220 may be one of T1, T2, T3, and T4 of FIG. 19. Since the display device 10 includes the fourth sound generator 240 which is configured to output a low-pitched sound, the sound pressure level, at each frequency, of the first sound generator 210 and the sound pressure level, at each frequency, of the second sound generator 220 may preferably be T3 or T4 because the first and second sound generators 210 and 220 do not need to have a high sound pressure level in the low-frequency range LFR. The sound pressure level, at each frequency, of the fourth sound generator 240 may be one of W1, W2, W3, and W4 of FIG. 19.

Alternatively, the sound output characteristics of the first sound generator 210 and the sound output characteristics of the second sound generator 220 may differ. For example, the sound pressure level, at each frequency, of the first sound generator 210 and the sound pressure level, at each frequency, of the second sound generator 220 may differ. For example, the F0 of the first sound generator 210 and the F0 of the second sound generator 220 may differ.

In the exemplary embodiment of FIGS. 16A and 16B, sound having a high sound pressure level in a high-frequency range is output using the first and second sound generators 210 and 220, and sound having a low sound pressure level in a low-frequency range is output using the fourth sound generator 240. Accordingly, the display device 10 may provide stereo sound of 2.1 channels to the user.

Figure 18:
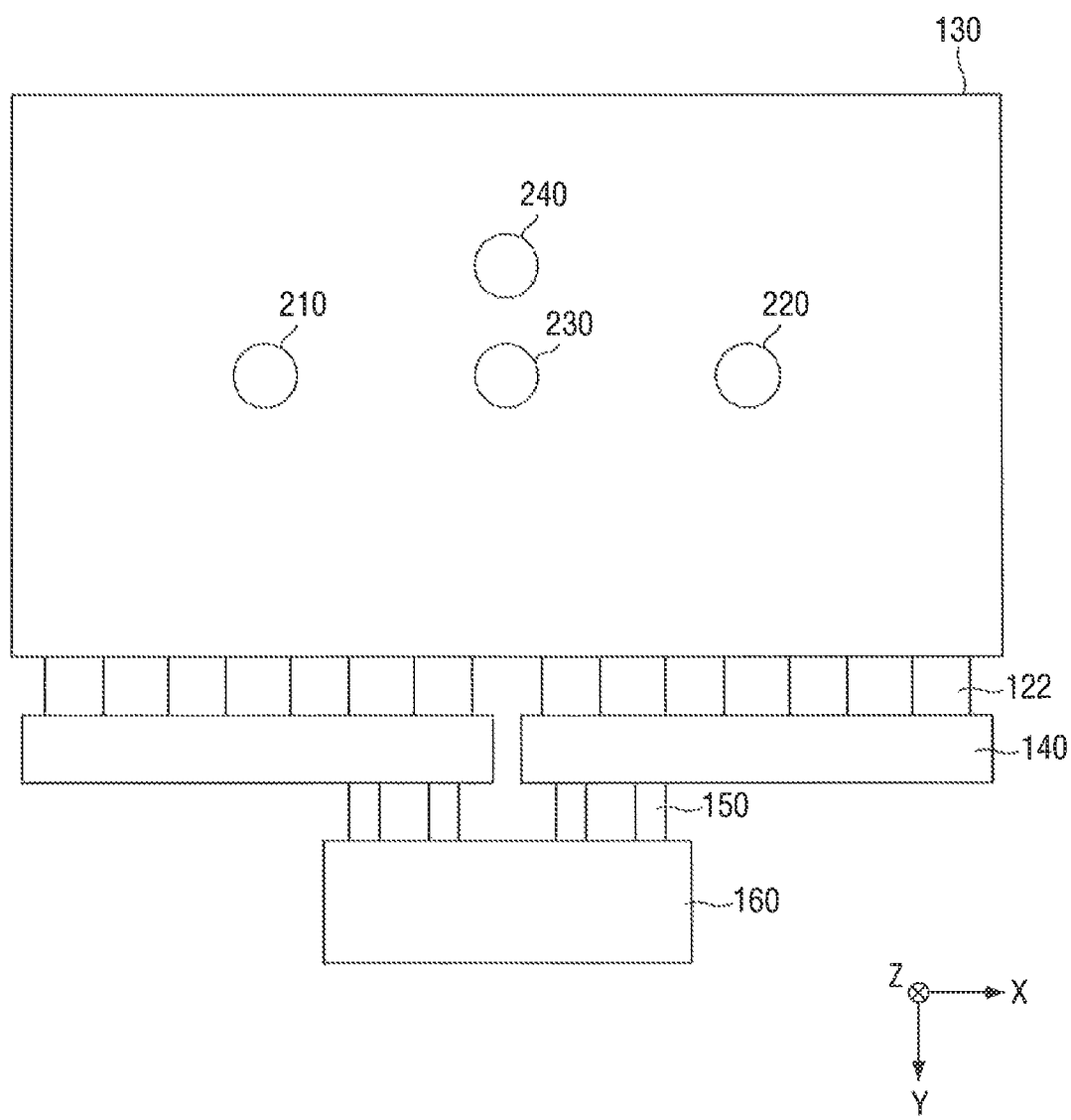
FIG. 18 is a bottom view of a display device according to another exemplary embodiment of the present inventive concepts.

FIG. 18 is a bottom view of a display device according to another exemplary embodiment of the present disclosure. It is noted that a display device 10 is shown reversed in FIG. 18, which is a bottom view, as compared to the display device 10 of FIGS. 1 and 2.

The embodiment of FIG. 18 differs from the embodiment of FIGS. 16A and 16B in that the display device 10 further includes a third sound generator 230. The embodiment of FIG. 18 will hereinafter be described, focusing mainly on the difference(s) with the embodiment of FIGS. 16A and 16B.

Referring to FIG. 18, the third sound generator 230 may be an exciter configured to generate a magnetic force using a voice coil and thereby causing a display panel 110 to vibrate, as illustrated in FIGS. 7 and 8. Alternatively, the third sound generator 230 may be a piezoelectric element configured to contract and expand in accordance with a voltage applied thereto and thereby causing the display panel 110 to vibrate, as illustrated in FIGS. 10 and 11. The third sound generator 230 may serve as a tweeter for outputting sound having a high sound pressure level in a high-frequency range.

A first sound generator 210 may be disposed adjacent to the center of the display panel 110. A second sound generator 220 may be disposed adjacent to the right side of the display panel 110. The third sound generator 230 may be disposed adjacent to the left side of the display panel 110. Accordingly, the first sound generator may be configured to output a first sound to the central front of the display panel 110. The second sound generator may be configured to output a second sound to the right front of the display panel 110. The third sound generator may be configured to output a third sound to the left front of the display panel 110, and low-pitched fourth sound may be output by the fourth sound generator 240. Therefore, the display device 10 may be configured to provide stereo sound of 3.1 channels to a user.

The F0 of the third sound generator 230 may be 1 kHz or higher. The sound output characteristics of the third sound generator 230 may be substantially the same as the sound output characteristics of the first sound generator 210 and the sound output characteristics of the second sound generator 220. For example, the F0 of the first sound generator 210, the F0 of the second sound generator 220, and the F0 of the third sound generator 230 may be substantially the same. The sound pressure level, at each respective frequency, of the first sound generator 210, the second sound generator 220, and the third sound generator 230 may be one of T1, T2, T3, and T4 of FIG. 19. Since the display device 10 includes the fourth sound generator 240 for outputting low-pitched sound, the sound pressure level, at each respective frequency, of the first sound generator 210 and the second sound generator 220 may preferably be T3 or T4 because the first and second sound generators 210 and 220 do not need to have a high sound pressure level in the low-frequency range LFR.

Alternatively, the sound output characteristics of the first sound generator 210, the second sound generator 220 and the third sound generator 230 may differ. For example, the sound pressure level, at each respective frequency, of the first sound generator 210, the second sound generator 220, and the third sound generator 230 may differ. For example, the F0 of the first sound generator 210, the F0 of the second sound generator 220, and the F0 of the third sound generator 230 may differ.

In the exemplary embodiment of FIGS. 16A and 16B, the first and second sound generators 210 and 220 are configured to output sound having a high sound pressure level in a high-frequency range. The fourth sound generator 240 is configured to output sound having a low sound pressure level in a low-frequency range. Accordingly, the display device 10 may be configured to provide stereo sound of 3.1 channels to the user.

FIG. 19 is a graph showing the sound pressure levels, at each frequency, of sound generated by sound generators.

Referring to FIG. 19, the X axis represents frequency (Hz), the Y axis represents sound pressure level (dB), and W1, W2, W3, and W4 represent sound pressure levels, at each frequency, of sound generated by sound generators that serve as woofers. The F0 of each of W1, W2, W3, and W4 may be within the low-frequency range LFR. The F0 of each of W1, W2, W3, and W4 may be 800 Hz or lower, preferably, 400 Hz or lower. W1, W2, W3, and W4 may gradually decrease at a predetermined slope in a mid-frequency range MFR and the high-frequency range HFR. The absolute values of the slopes of W1, W2, W3, and W4 in the mid- and high-frequency ranges MFR and HFR may be greater from W1 to W2 to W3 to W4. The characteristics of sound generated by each sound generator that serves as a woofer may be set to one of W1, W2, W3, and W4.

Referring to FIG. 19, T1, T2, T3, and T4 refer to the sound pressure levels, at each frequency, of sound generated by sound generators that serve as tweeters. The F0 of each of T1, T2, T3, and T4 may be within the high-frequency range HFR. The F0 of each of T1, T2, T3, and T4 may be 1 kHz or higher. T1, T2, T3, and T4 may gradually increase at a predetermined slope in the low- and mid-frequency ranges LFR and MFR. The absolute values of the slopes of T1, T2, T3, and T4 in the low- and mid-frequency ranges LFR and MFR may be greater from T1 to T2 to T3 to T4. The characteristics of sound generated by each sound generator that serves as a tweeter may be set to one of T1, T2, T3, and T4.

Figure 20:
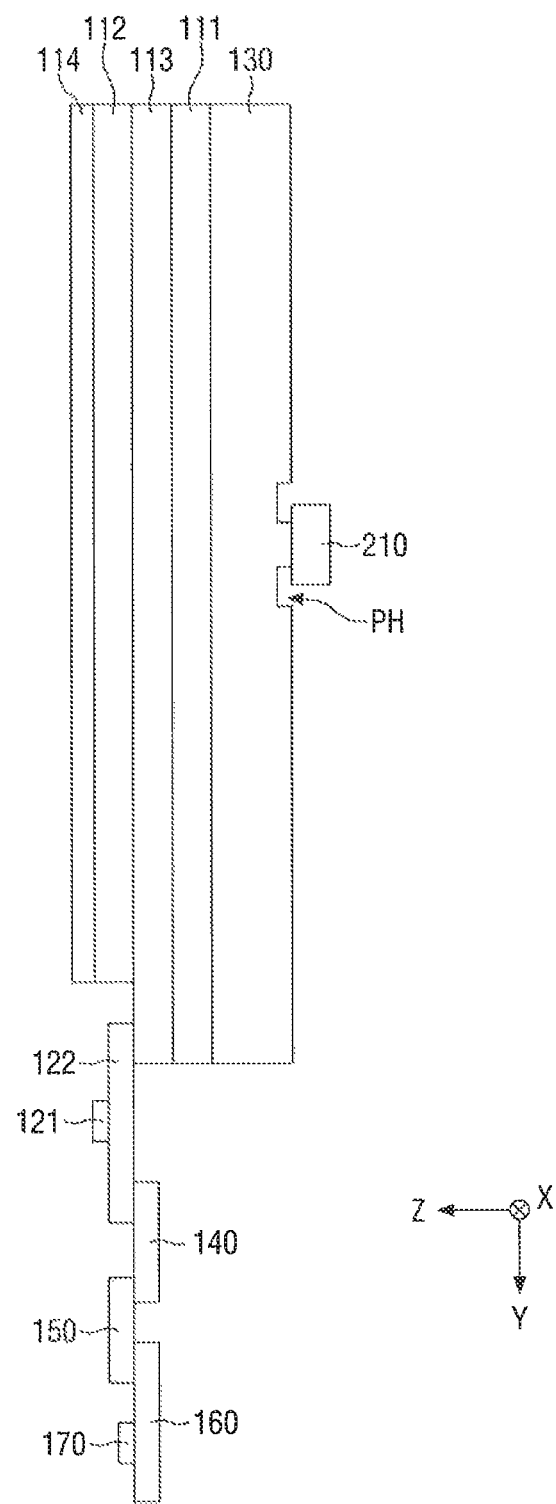
FIG. 20 is a side view illustrating an exemplary display panel of FIG. 2 according to an exemplary embodiment of the present inventive concepts.

FIG. 20 is a side view illustrating an exemplary display panel of FIG. 2. FIGS. 21A through 21E are bottom views illustrating exemplary bobbins and exemplary heat dissipation pass holes of exemplary first sound generators. FIG. 22 is a cross-sectional view taken along line III-III' of FIG. 21A. For convenience, a magnet 211, a voice coil 213, and dampers 214 of a first sound generator 210 are not illustrated in FIGS. 21A through 21E.

The exemplary embodiments of FIGS. 20, 21A through 21E, and 22 differ from the embodiments of FIGS. 1 through 6 in that heat dissipation pass holes PH are formed on a surface of a first heat dissipation film 130 where a first sound generator 210 is disposed. The exemplary embodiments of FIGS. 20, 21A through 21E, and 22 will hereinafter be described, focusing mainly on the differences with the embodiments of FIGS. 1 through 6.

Figure 21A:
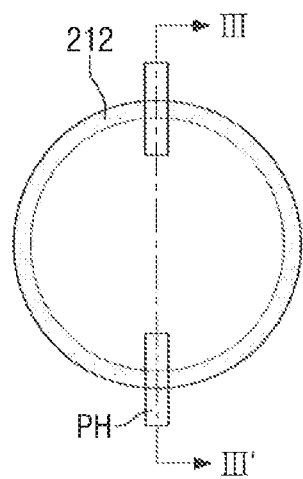
FIGS. 21A through 21E are bottom views illustrating bobbins and heat dissipation pass holes of first sound generators according to exemplary embodiments of the present inventive concepts.
Figure 21B:
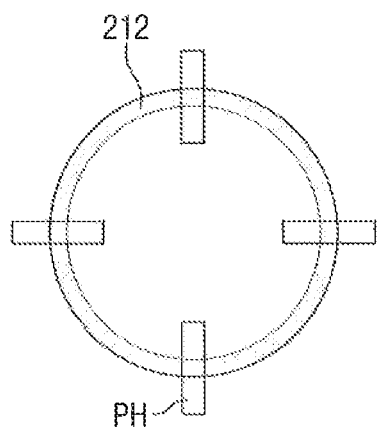
Figure 21C:
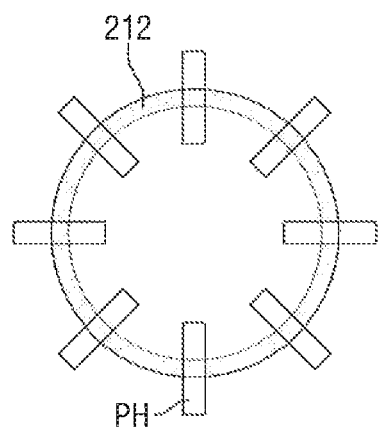
Figure 21D:
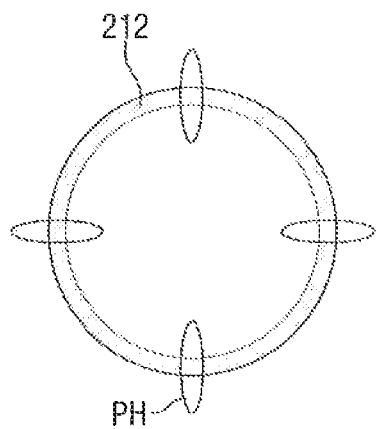
Figure 21E:
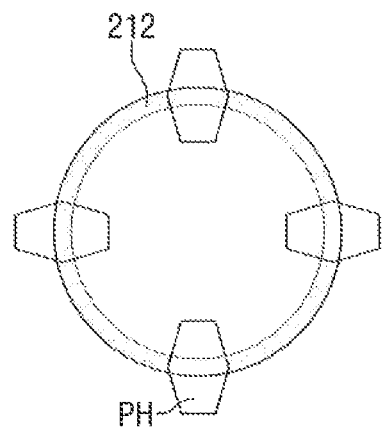
Figure 22:
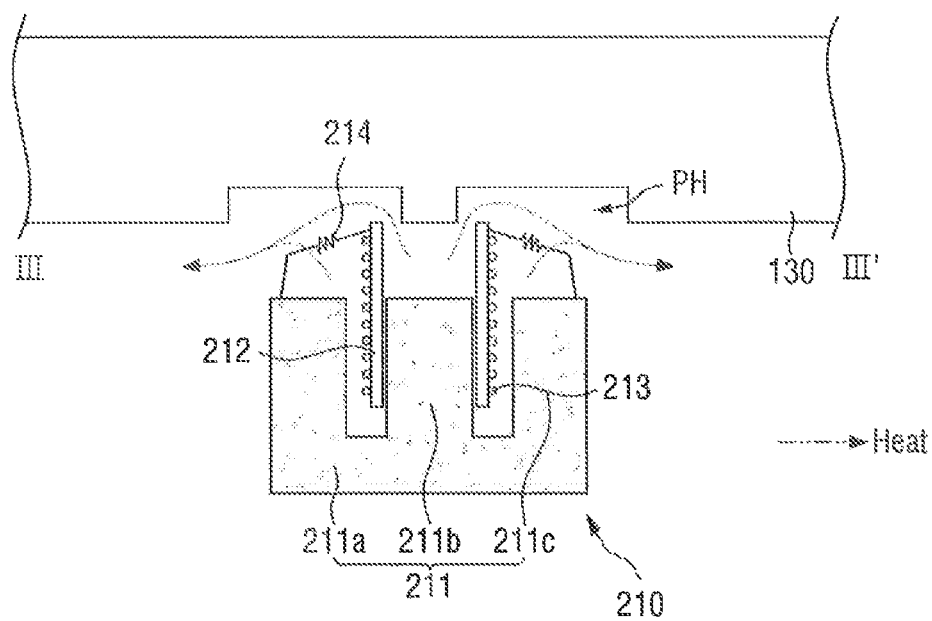
FIG. 22 is a cross-sectional view taken along line of FIG. 21A according to an exemplary embodiment of the present inventive concepts.

Referring to FIGS. 20, 21A through 21E, and 22, heat dissipation pass holes PH are formed on a surface of a first heat dissipation film 130 where a first sound generator 210 is disposed. The heat dissipation pass holes PH may overlap with the edge of the first sound generator 210. In an embodiment where the first sound generator 210 is an exciter configured to generate a magnetic force using a voice coil and thereby causing a display panel 110 to vibrate, the heat dissipation pass holes PH may overlap with a bobbin 212 of the first sound generator 210, as illustrated in FIGS. 21A and 22. In this case, heat generated by a voice coil 213 wound around the bobbin 212 of the first sound generator 210 may be discharged, as indicated by arrows of FIG. 22, instead of being trapped inside the bobbin 212. The heat dissipation holes PH may be configured to effectively release heat generated by the first sound generator 210. Accordingly, the influence of the heat generated by the first sound generator 210 on the display panel 110 may be minimized by the first heat dissipation film 130.

Figure 23:
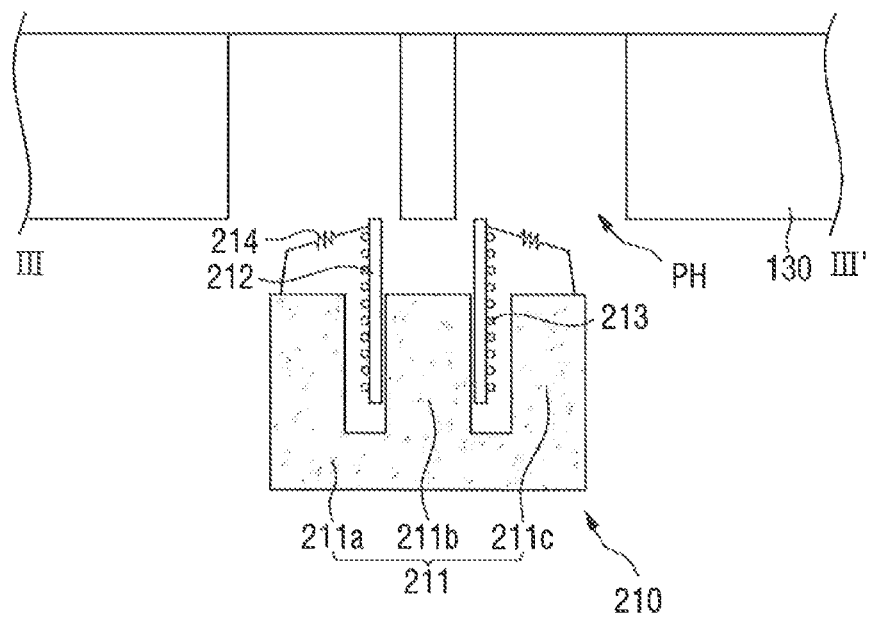
FIG. 23 is a cross-sectional view taken along line of FIG. 21A according to an exemplary embodiment of the present inventive concepts.

The heat dissipation pass holes PH may be recessed holes formed on the first heat dissipation film 130, as illustrated in the exemplary embodiments shown in FIGS. 20 and 22. However, the present disclosure is not limited thereto. Alternatively, the heat dissipation pass holes PH may be through holes penetrating the first heat dissipation film 130, as illustrated in FIG. 23.

In the exemplary embodiment shown in FIG. 21A, two heat dissipation pass holes PH are formed. However, exemplary embodiments of the present inventive concepts are not limited thereto. Alternatively, as illustrated in FIG. 21B, four heat dissipation pass holes PH or eight heat dissipation pass holes PH may be formed on the first heat dissipation film 130. As the number of heat dissipation pass holes PH increases, the number of paths via which heat generated by the first sound generator 210 is discharged increases, and as a result, the heat dissipation effect of the first heat dissipation film 130 may be improved. However, as the number of heat dissipation pass holes PH increases, the contact area between the first sound generator 210 and the first heat dissipation film 130 decreases, and as a result, the adhesiveness between the first sound generator 210 and the first heat dissipation film 130 decreases. Accordingly, the number of heat dissipation pass holes PH may be appropriately set in consideration of heat dissipation efficiency and the adhesiveness between the first sound generator 210 and the first heat dissipation film 130.

In the exemplary embodiment shown in FIG. 21A, the heat dissipation pass holes PH have a rectangular shape in a plan view. However, exemplary embodiments of the present inventive concepts are not limited thereto. Alternatively, the heat dissipation pass holes PH may have an elliptical shape in a plan view, as illustrated in FIG. 21D, or may have a hexagonal shape in a plan view, as illustrated in FIG. 21E. In other alternative embodiments, the heat dissipation pass holes PH may have a circular shape or a polygonal shape other than a rectangular or hexagonal shape in a plan view.

In the exemplary embodiments of FIGS. 20, 21A through 21E, and 22, the heat dissipation pass holes PH are formed on the first heat dissipation film 130 to overlap with the first sound generator 210, and heat generated by the first sound generator 210 may be effectively discharged by the heat dissipation pass holes PH. Accordingly, the influence of the heat generated by the first sound generator 210 on the display panel 110 may be minimized by the first heat dissipation film 130.

Figure 24A:
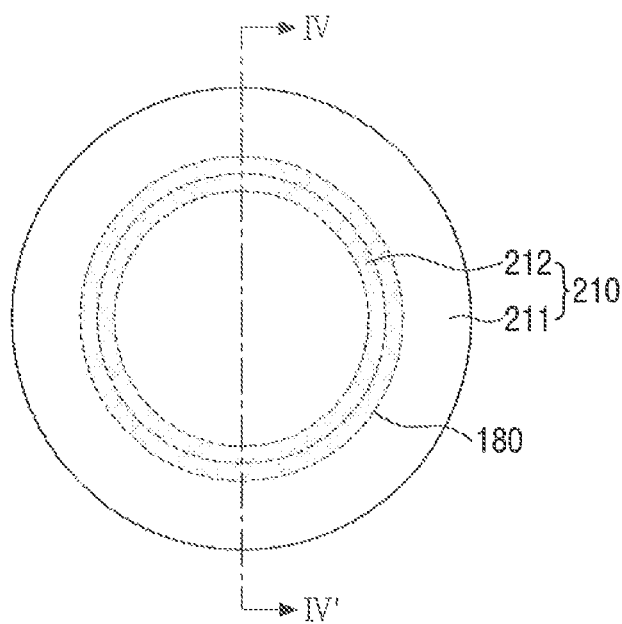
FIG. 24A is a plan view illustrating a first sound generator and a second heat dissipation film according to an exemplary embodiment of the present inventive concepts.
Figure 24B:
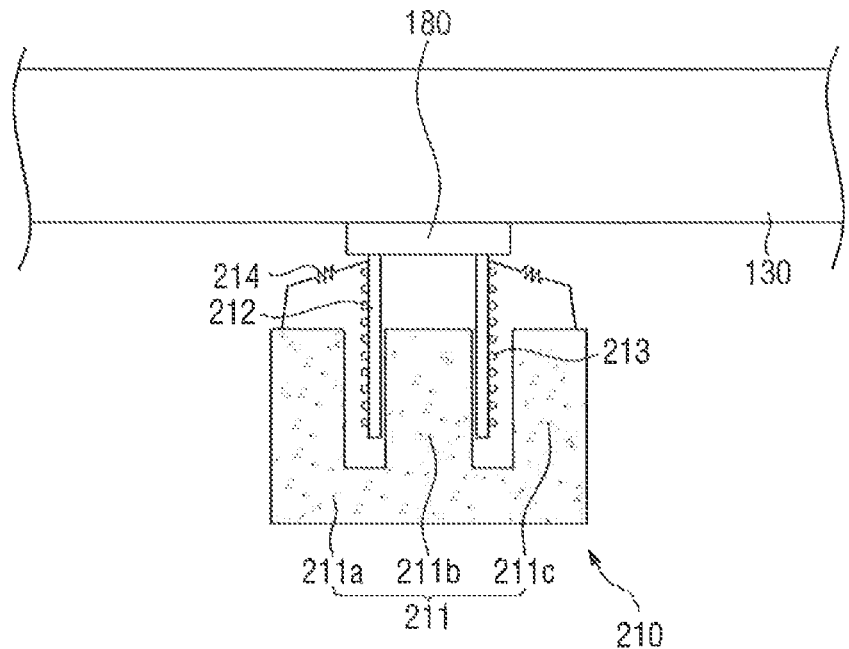
FIGS. 24B and 24C are cross-sectional views taken along line IV-IV' of FIG. 24A according to an exemplary embodiment of the present inventive concepts.

FIG. 24A is a plan view illustrating an exemplary first sound generator and an exemplary second heat dissipation film. FIG. 24B is a cross-sectional view taken along line IV-IV' of FIG. 24A. The embodiment of FIGS. 24A and 24B differs from the embodiments of FIGS. 1 through 6 in that a display device 10 further includes a second heat dissipation film 180. The embodiment of FIGS. 24A and 24B will hereinafter be described, focusing mainly on the difference(s) with the embodiments of FIGS. 1 through 6.

Referring to FIGS. 24A and 24B, the second heat dissipation film 180 may be disposed on a surface of a first heat dissipation film 130 where a first sound generator 210 is disposed. In an exemplary embodiment, the second heat dissipation film 180 may be formed in one integral body with the first heat dissipation film 130. However, in alternative embodiments, the second heat dissipation film 180 may be formed separately from the first heat dissipation film 130. The first heat dissipation film 130 may be configured to cover an entire first substrate 111, and the second heat dissipation film 180 may be disposed to cover part of the first heat dissipation film 130. For example, the second heat dissipation film 180 may overlap with the first sound generator 210. In an embodiment where the first sound generator 210 is an exciter configured to generate a magnetic force using a voice coil and thereby causing a display panel 110 to vibrate, the second heat dissipation film 180 may overlap with a bobbin 212 of the first sound generator 210, as illustrated in FIG. 24. The second heat dissipation film 180 may include a metal layer formed of Cu or Al, a ceramic layer formed of a piezoelectric material, or aerogel. In this embodiment, since heat generated by the first sound generator 210 may be blocked by the second heat dissipation film 130, the influence of the heat generated by the first sound generator 210 on the display panel 110 may be prevented.

Figure 24C:
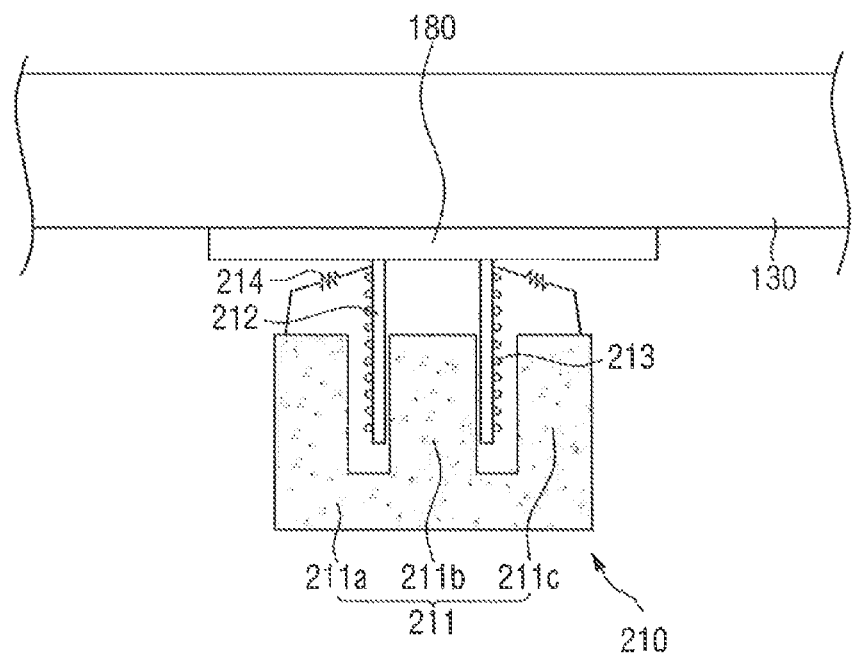

In the exemplary embodiment illustrated in FIG. 24B, the width of a heat dissipation layer 133 of the first heat dissipation film 130 may be smaller than the width of the first sound generator 210. However, exemplary embodiments of the present inventive concepts are not limited thereto. Alternatively, as illustrated in FIG. 24C, the width of the heat dissipation layer 133 of the first heat dissipation film 130 may be greater than the width of the first sound generator 210.

Figure 25:
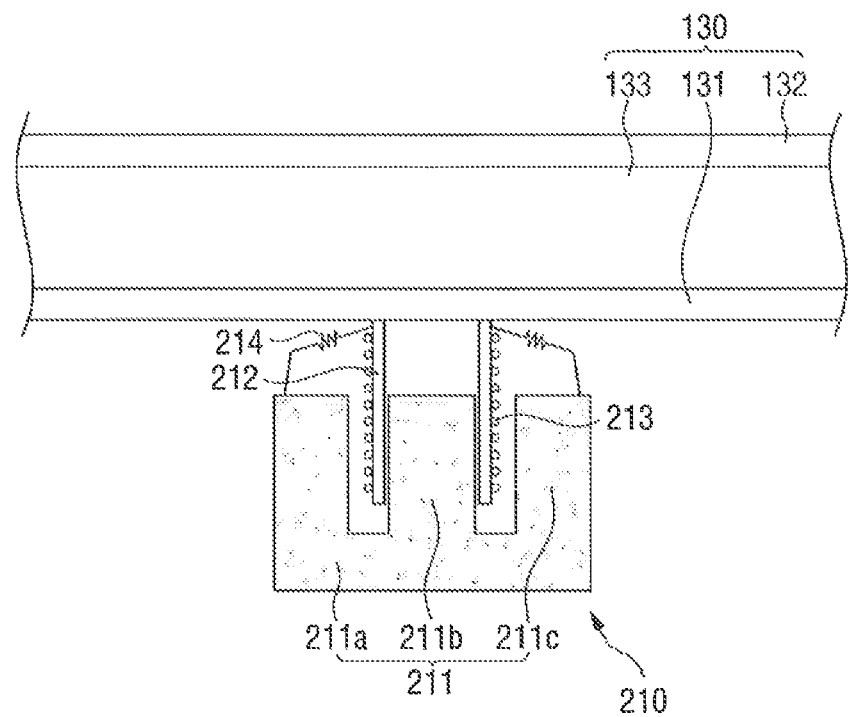
FIG. 25 is a cross-sectional view illustrating a first sound generator and a first heat dissipation film according to an exemplary embodiment of the present inventive concepts.

FIG. 25 is a cross-sectional view illustrating an exemplary first sound generator and an exemplary first heat dissipation film. The embodiment of FIG. 25 differs from the embodiments of FIGS. 1 through 6 in that a first heat dissipation film 130 includes vibration transmission layers in addition to a heat dissipation layer. The embodiment of FIG. 25 will hereinafter be described, focusing mainly on the difference(s) with the embodiments of FIGS. 1 through 6.

Referring to FIG. 25, the first heat dissipation film 130 may include a first vibration transmission layer 131, a second vibration transmission layer 132, and a heat dissipation layer 133.

The heat dissipation layer 133 may be configured to discharge heat generated by a first sound generator 210. The heat dissipation layer 133 may include a layer of a metal with high thermal conductivity such as graphite, Ag, Cu, or Al.

The heat dissipation layer 133 may include a plurality of metal layers formed in a first direction (e.g., an X-axis direction) and a second direction (e.g., a Y-axis direction), rather than in a third direction (e.g., a Z-axis direction). In this embodiment, heat generated by the voice coil of the first sound generator 210 may be diffused in the first direction (e.g., an X-axis direction) and the second direction (e.g., a Y-axis direction) and may be effectively released. Accordingly, the influence of heat generated by the first sound generator 210 on a display panel 110 may be minimized by the first heat dissipation film 130.

The first vibration transmission layer 131 may be disposed on a first surface of the heat dissipation layer 133. The second vibration transmission layer 132 may be disposed on a second surface of the heat dissipation layer 133. The second surface of the heat dissipation layer 133, which is opposite to the first surface of the heat dissipation layer 133, may face a first substrate 111. The first sound generator 210 may be attached on the first vibration transmission layer 131 via an adhesive member such as an adhesive tape. The second vibration transmission layer 132 may be attached to the first substrate 111 via an adhesive member such as a pressure sensitive adhesive (PSA).

The first and second vibration transmission layers 131 and 132 may be formed of PI. In an embodiment where the heat dissipation layer 133 includes a plurality of metal layers formed in the first and second directions (e.g., the X- and Y-axis directions), rather than in the third direction (e.g., the Z-axis direction), the transmission of the vibration of the first sound generator 210 to the first substrate 111 may be reduced due to the heat dissipation layer 133. Therefore, the force delivered from the first sound generator 210 to the first substrate 111 through the vibration of the first sound generator 210 may be strengthened when the first heat dissipation film 130 includes the first vibration transmission layer 131, the second vibration transmission layer 132, and the heat dissipation layer 133, as compared to when the first heat dissipation film 130 only includes the heat dissipation layer 133. Accordingly, the output of first sound through the vibration of the display panel 110 using the first sound generator 210 may be facilitated.

The exemplary embodiments of FIGS. 26A, 26B, 27, and 28 differ from the embodiment of FIG. 25 in that a part of a heat dissipation film 133 of a first heat dissipation film 130 is removed. The exemplary embodiments of FIGS. 26A, 26B, 27, and 28 will hereinafter be described, focusing mainly on the difference(s) with the embodiment of FIG. 25.

Figure 26A:
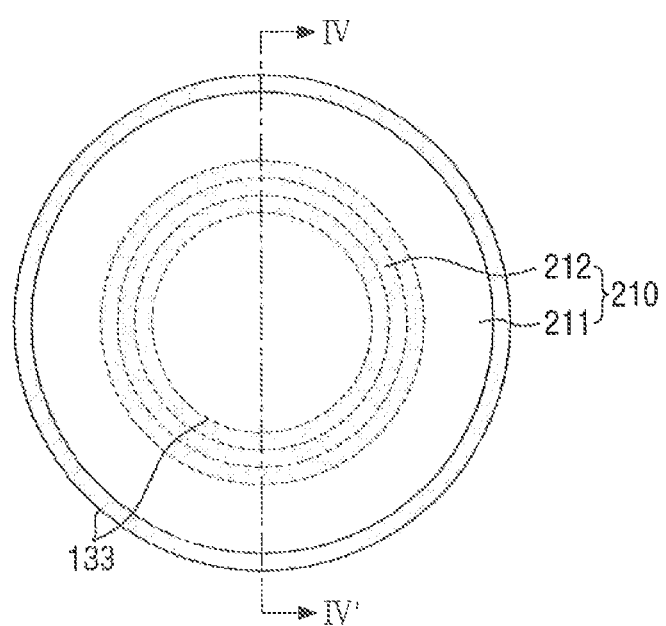
FIG. 26A is a plan view illustrating a first sound generator and a heat dissipation layer of a first heat dissipation film according to an exemplary embodiment of the present inventive concepts.
Figure 26B:
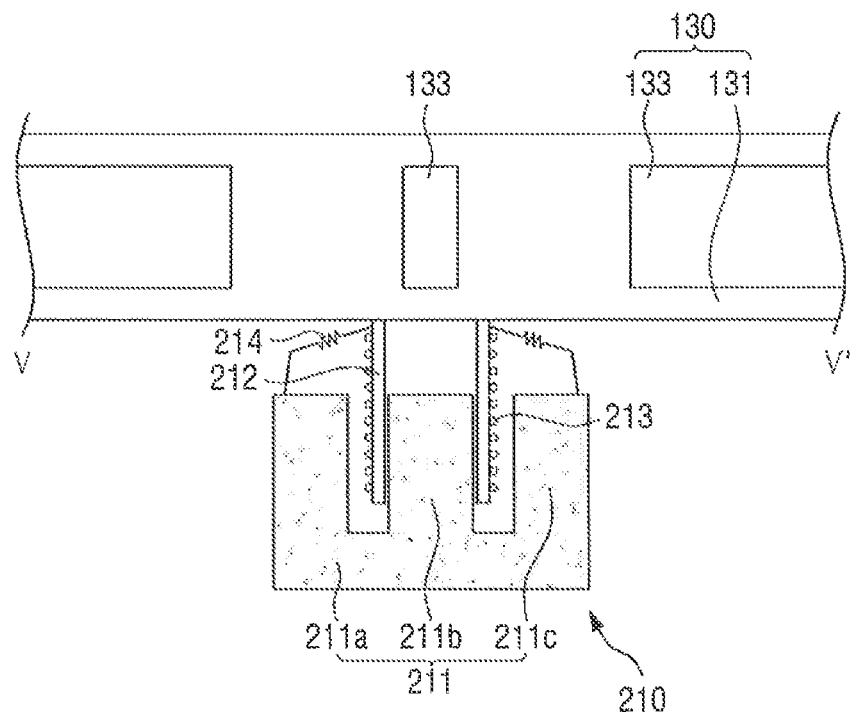
FIGS. 26B, 27, and 28 are cross-sectional views taken along line V-V' of FIG. 26A according to exemplary embodiments of the present inventive concepts.
Figure 27:
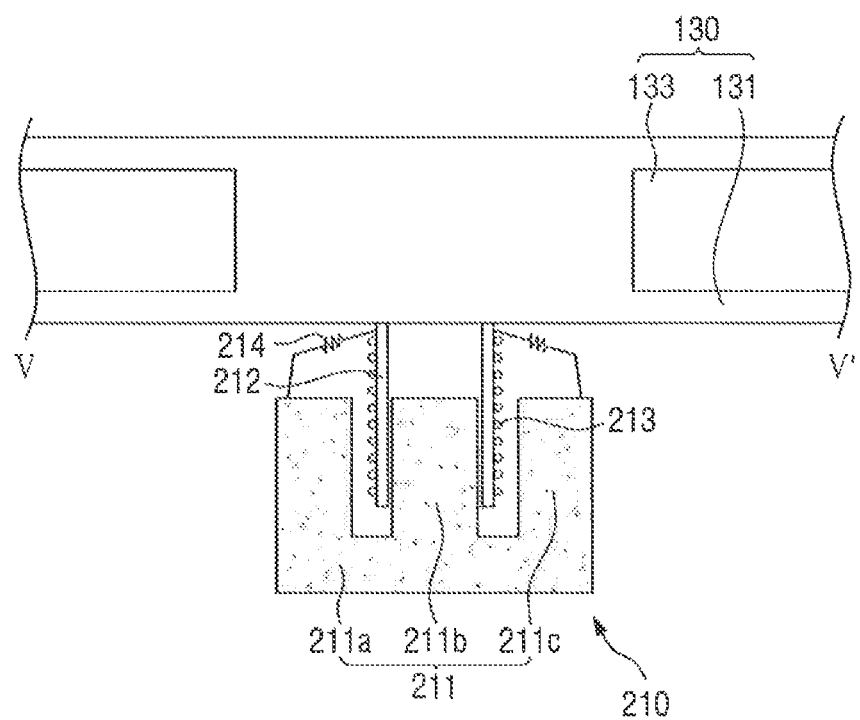

Referring to FIGS. 26A and 26B, a heat dissipation layer 133 does not overlap with a bobbin 212 of a first sound generator 210. Instead, a first vibration transmission layer 131 may overlap with the bobbin 212 of the first sound generator 210. Specifically, a force delivered from the first sound generator 210 to a first substrate 111 may be caused by the vibration of the bobbin 212. Thus, when the heat dissipation layer 133 does not overlap with the bobbin 212 of the first sound generator 210, the force delivered from the first sound generator 210 to the first substrate 111 through the vibration of the bobbin 212 may be strengthened.

FIGS. 26A and 26B illustrate that the heat dissipation layer 133 overlaps with a central protruding part 211b inside the bobbin 212, but the present disclosure is not limited thereto. Alternatively, the heat dissipation layer 133 may overlap with the bobbin 212 and with the central protruding part 211b inside the bobbin 212. In this embodiment, the first vibration transmission layer 131 may overlap not only with the bobbin 212, but also with the central protruding part 211b inside the bobbin 212.

Figure 28:
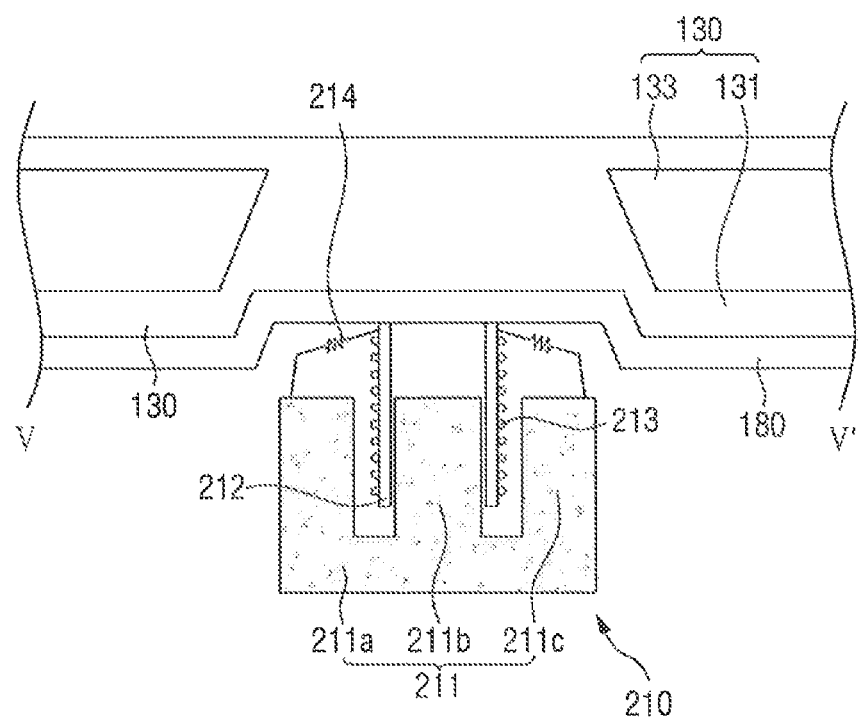

Referring to FIG. 28, a heat dissipation layer 133 does not overlap with either a bobbin 212 of a first sound generator 210 or a central protruding part 211b inside the bobbin 212. Instead, a first vibration transmission layer 131 may overlap with the bobbin 212. The first heat dissipation film 130 may be thinner in an area that overlaps with the bobbin 212 than in an area that does not overlap with the bobbin 212. That is, the first heat dissipation film 130 may include a recessed part in the area that overlaps with the bobbin 212. In this embodiment, the force delivered from the first sound generator 210 to the first substrate 111 through the vibration of the bobbin 212 of the first sound generator 210 may be strengthened.

A second heat dissipation film 180 may be disposed on a recessed part of the first vibration transmission layer 131. The bobbin 212 of the first sound generator 210 may be disposed on the second heat dissipation film 180. The second heat dissipation film 180 may be a metal layer formed of Cu or Al or a ceramic layer formed of a piezoelectric material. In this embodiment, since heat generated by the first sound generator 210 may be blocked by the second heat dissipation film 130, the influence of the heat generated by the first sound generator 210 on a display panel 110 may be prevented. Also, a force generated by the vibration of the bobbin 212 of the first sound generator 210 may be delivered to the first substrate 111 through the second heat dissipation film 180.

Figure 29A:
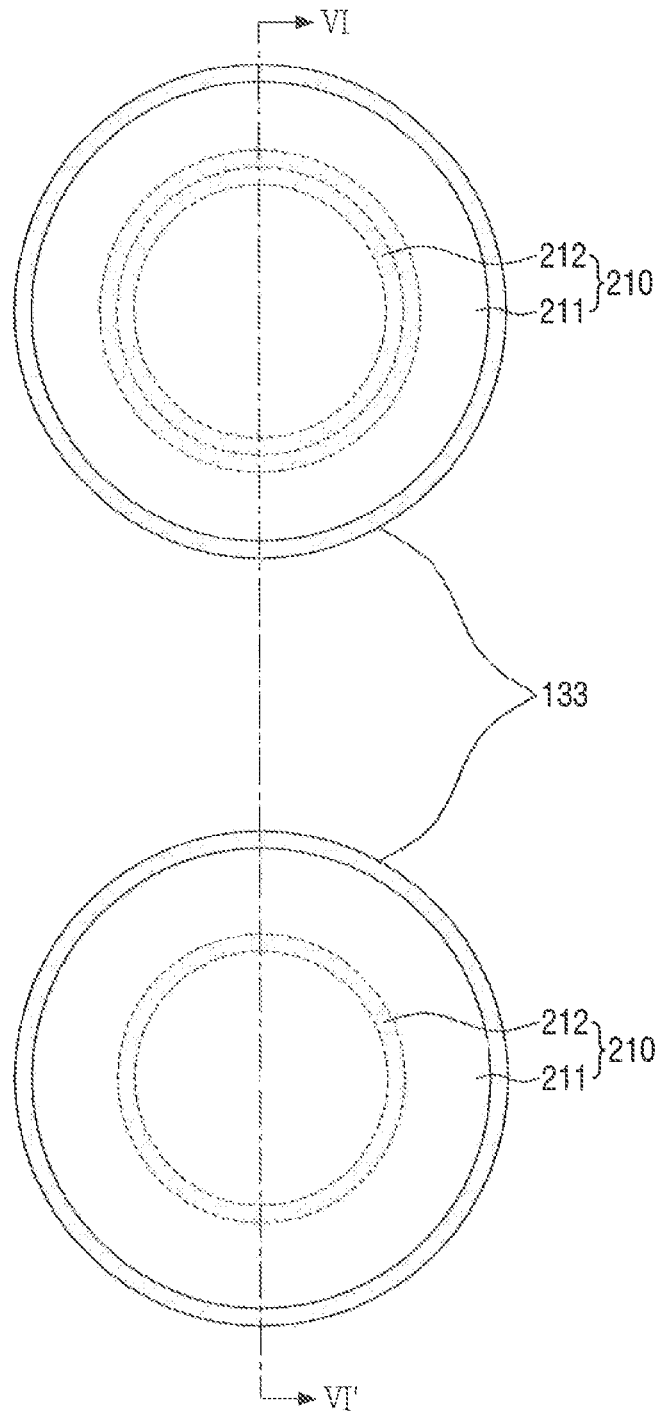
FIG. 29A is a plan view illustrating an exemplary first sound generator, an exemplary second sound generator, and an exemplary heat dissipation layer of an exemplary first heat dissipation film according to an exemplary embodiment of the present inventive concepts.

The exemplary embodiments of FIGS. 29A and 29B differ from the embodiment of FIG. 28 in that a plurality of sound generators 210 are disposed on a second heat dissipation film 180. The embodiment of FIGS. 29A and 29B will hereinafter be described, focusing mainly on the difference(s) with the embodiment of FIG. 28.

Referring to FIGS. 29A and 29B, a larger force may be delivered to a first substrate 111 when multiple sound generators 210 are provided on a second heat dissipation film 180 than when a single sound generator 210 is provided on the second heat dissipation film 180 because of the vibration of multiple bobbins 212 of the multiple sound generators 210. A single sound may be output by causing a display panel 110 to vibrate using the multiple sound generators 210.

Figure 30A:
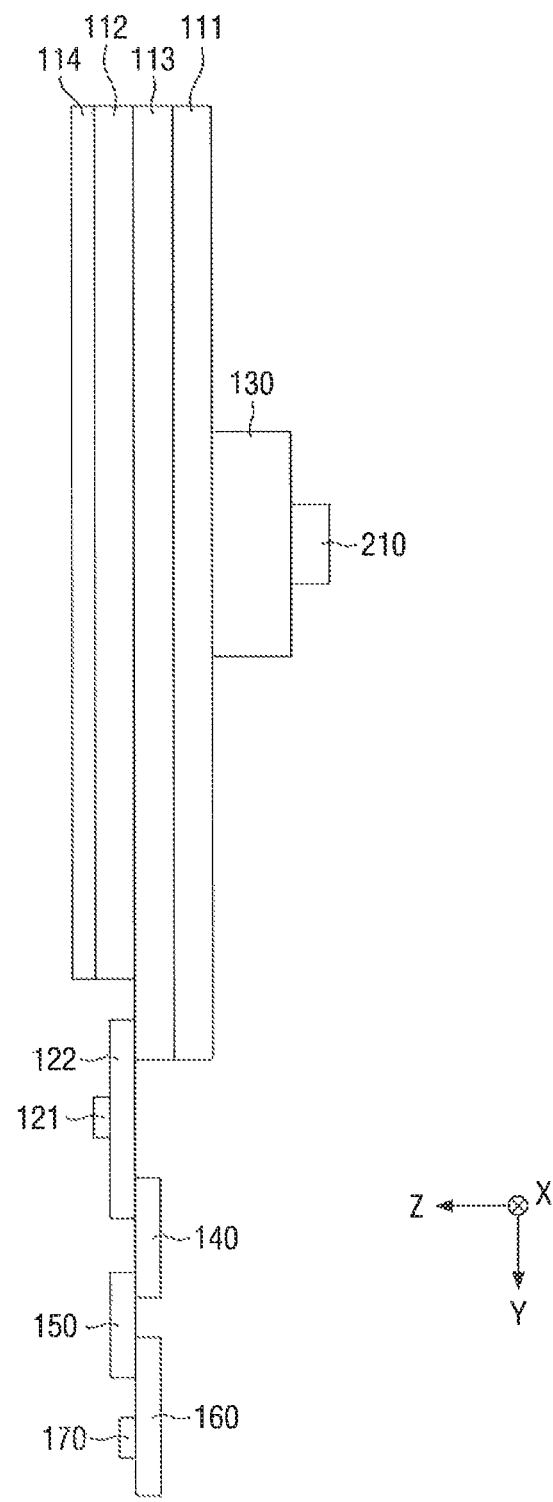
FIGS. 30A and 30B are a side view and a bottom view, respectively, of a display device according to another exemplary embodiment of the present inventive concepts.
Figure 30B:
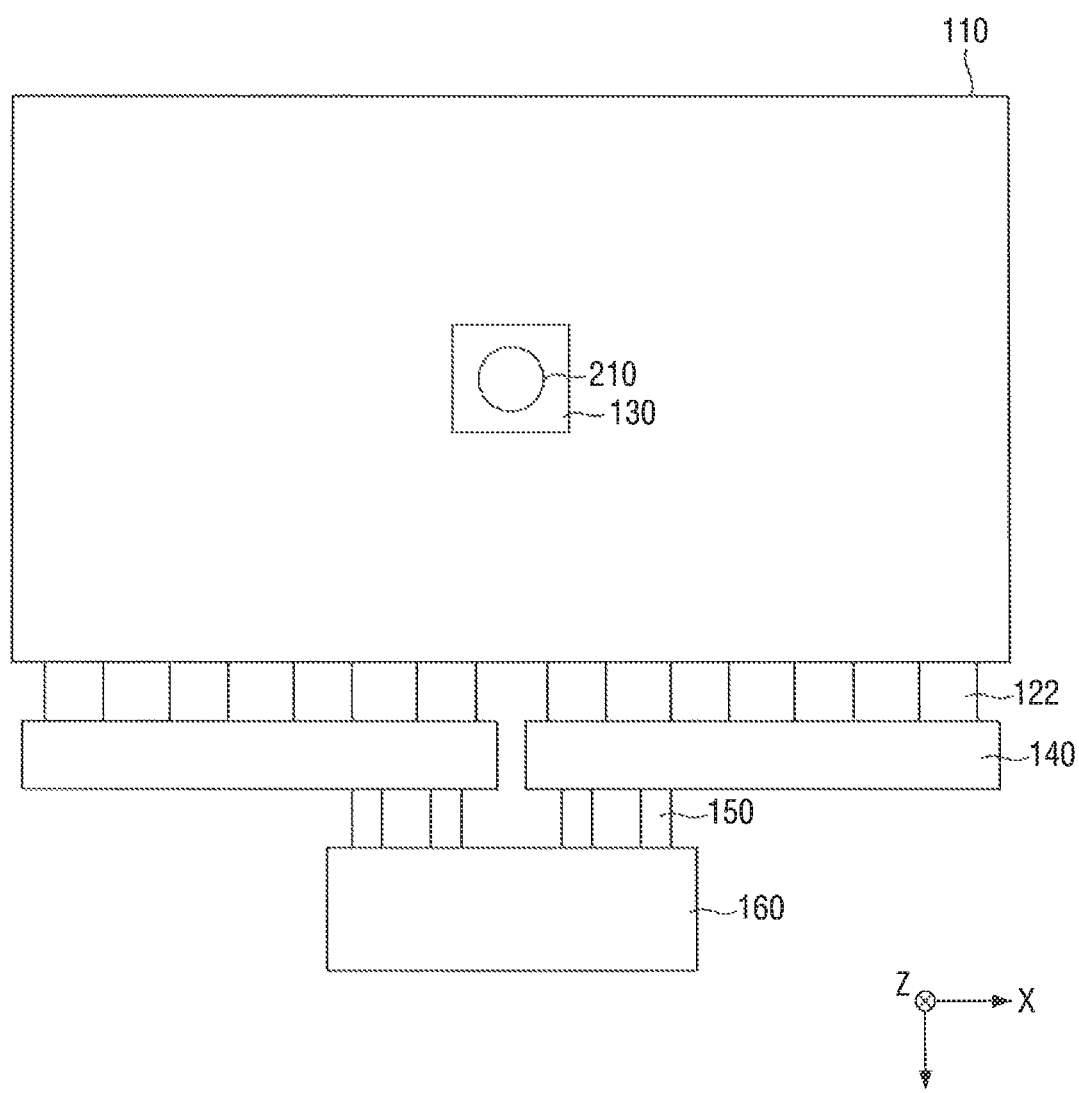

The exemplary embodiments of FIGS. 30A and 30B differ from the embodiments of FIGS. 1 through 6 in that a first heat dissipation film 130 is disposed to cover a part of the surface of a first substrate 111, rather than the entire surface of the first substrate 111. The exemplary embodiment of FIGS. 30A and 30B will hereinafter be described, focusing mainly on the difference(s) with the embodiments of FIGS. 1 through 6.

Referring to FIGS. 30A and 30B, a first heat dissipation film 130 may be disposed to cover a part of the surface of a first substrate 111, rather than the entire surface of the first substrate 111. Since the first heat dissipation film 130 is configured for dissipating heat generated by a first sound generator 210, the first heat dissipation film 130 may overlap with the first sound generator 210. In this embodiment, the width, in a first direction (e.g., an X-axis direction), of the first heat dissipation film 130 may be greater than the width, in the first direction (e.g., the X-axis direction), of the first sound generator 210, and the width, in a second direction (e.g., a Y-axis direction), of the first heat dissipation film 130 may be greater than the width, in the second direction (e.g., the Y-axis direction), of the first sound generator 210.

Figure 31:
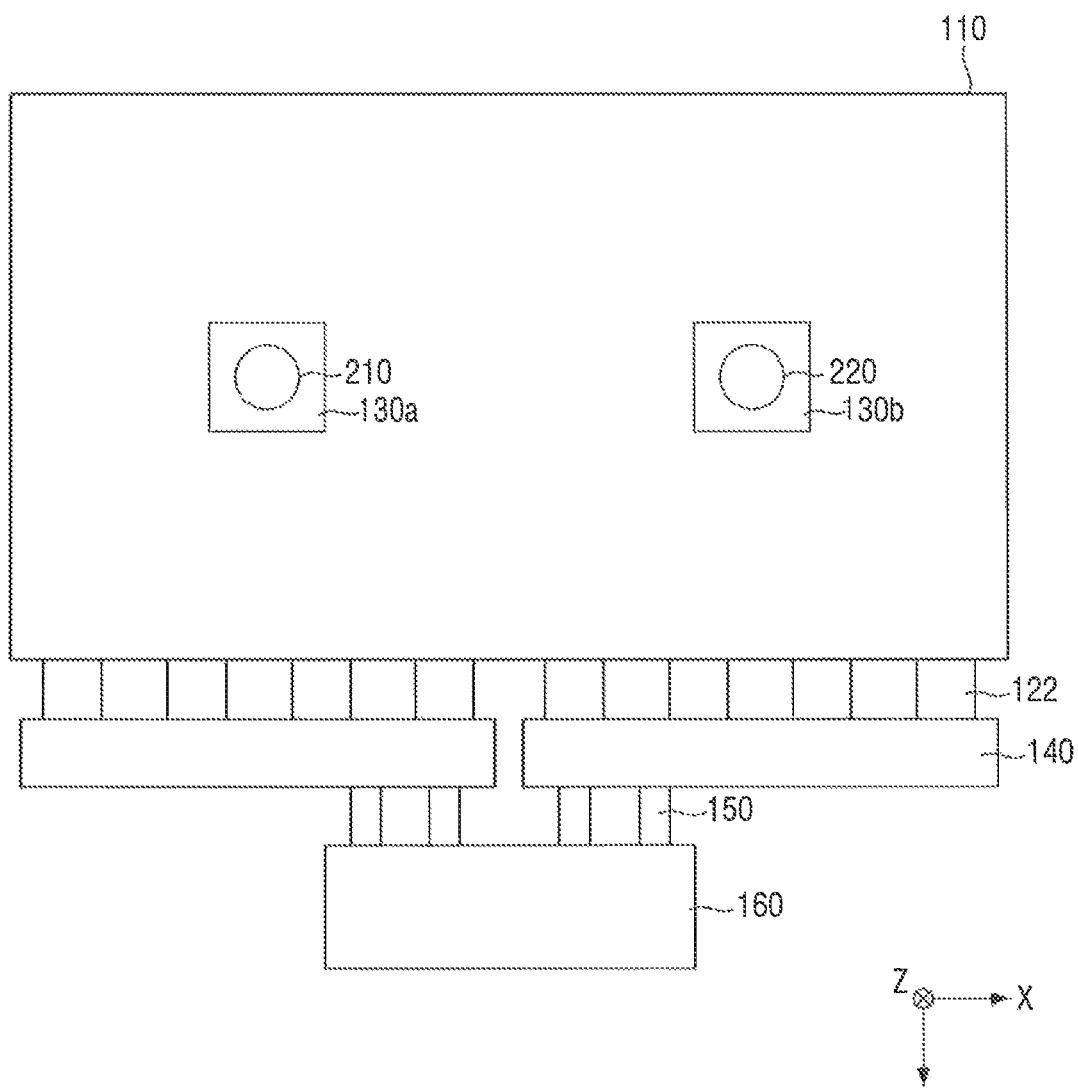
FIG. 31 is a bottom view of a display device according to another exemplary embodiment of the present inventive concepts.

The exemplary embodiment of FIG. 31 differs from the embodiments of FIGS. 1 through 6 in that a plurality of heat dissipation films (130a and 130b) are disposed to overlap with a plurality of sound generators (210 and 220). The exemplary embodiment of FIG. 31 will hereinafter be described, focusing mainly on the difference(s) with the exemplary embodiments of FIGS. 1 through 6.

Referring to FIG. 31, first and second heat dissipation films 130a and 130b may be disposed to cover a part of the surface of a first substrate 111, rather than the entire surface of the first substrate 111.

A first sound generator 210 may be disposed adjacent to the right side of a display panel 110, and a second sound generator 220 may be disposed adjacent to the left side of the display panel 110. Since the first heat dissipation film 130a is configured to dissipate heat generated by the first sound generator 210, the first heat dissipation film 130a may overlap with the first sound generator 210. In this embodiment, the width, in a first direction (e.g., an X-axis direction), of the first heat dissipation film 130a may be greater than the width, in the first direction (e.g., the X-axis direction), of the first sound generator 210, and the width, in a second direction (e.g., a Y-axis direction), of the first heat dissipation film 130a may be greater than the width, in the second direction (e.g., the Y-axis direction), of the first sound generator 210.

Since the second heat dissipation film 130b is configured for dissipating heat generated by the second sound generator 220, the second heat dissipation film 130b may overlap with the second sound generator 220. In this embodiment, the width, in the first direction (e.g., the X-axis direction), of the second heat dissipation film 130b may be greater than the width, in the first direction (e.g., the X-axis direction), of the second sound generator 220, and the width, in the second direction (e.g., the Y-axis direction), of the second heat dissipation film 130b may be greater than the width, in the second direction (e.g., the Y-axis direction), of the second sound generator 220.

Figure 32:
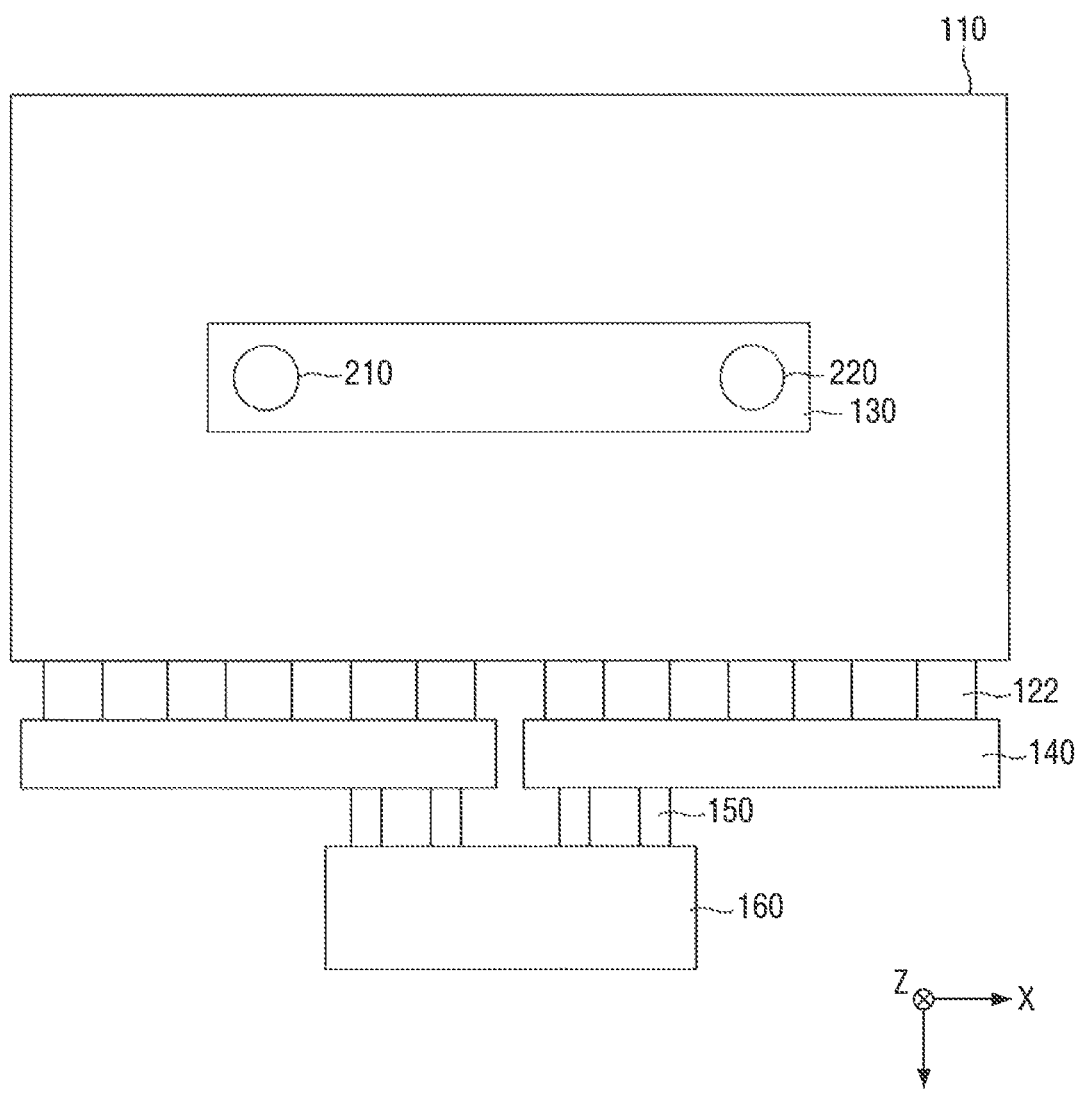
FIG. 32 is a bottom view of a display device according to another exemplary embodiment of the present inventive concepts.

The exemplary embodiment of FIG. 32 differs from the embodiments of FIGS. 1 through 6 in that a first heat dissipation film 130 may be disposed to cover a part of the surface of a first substrate 111, rather than the entire surface of the first substrate 111. The exemplary embodiment of FIG. 32 will hereinafter be described, focusing mainly on the difference(s) with the embodiments of FIGS. 1 through 6.

Referring to FIG. 32, a first sound generator 210 may be disposed adjacent to the right side of a display panel 110, and a second sound generator 220 may be disposed adjacent to the left side of the display panel 110. Since the first heat dissipation film 130 is for dissipating heat generated by the first and second sound generators 210 and 220, the first heat dissipation film 130 may overlap with the first and second sound generators 210 and 220. In this embodiment, the width, in a first direction (e.g., an X-axis direction), of the first heat dissipation film 130 may be greater than the maximum distance, in the first direction (e.g., the X-axis direction), between the first and second sound generators 210 and 220, and the width, in a second direction (e.g., a Y-axis direction), of the first heat dissipation film 130 may be greater than the width, in the second direction (e.g., the Y-axis direction), of the first sound generator 210.

Alternatively, the first sound generator 210 may be disposed adjacent to the upper side of the display panel 110, and the second sound generator 220 may be disposed adjacent to the lower side of the display panel 110. In this embodiment, the width, in the first direction (e.g., the X-axis direction), of the first heat dissipation film 130 may be greater than the widths, in the first direction (e.g., the X-axis direction), of the first and second sound generators 210 and 220, and the width, in the second direction (e.g., the Y-axis direction), of the first heat dissipation film 130 may be greater than the maximum distance, in the second direction (e.g., the Y-axis direction), between the first and second sound generators 210 and 220 and may also be greater than the widths, in the second direction (e.g., the Y-axis direction), of the first and second sound generators 210 and 220.

Figure 33:
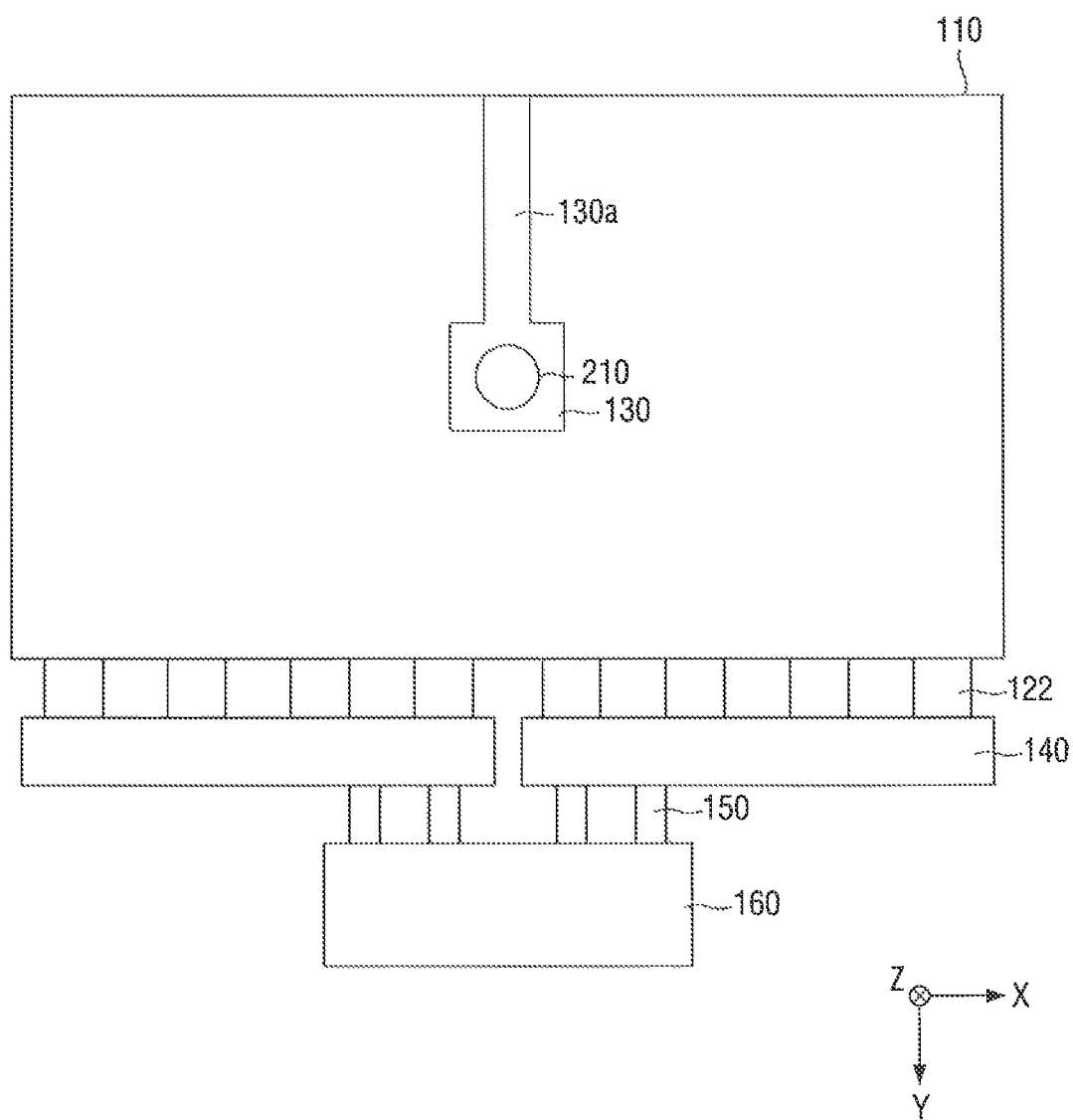
FIG. 33 is a bottom view of a display device according to another exemplary embodiment of the present inventive concepts.

FIG. 33 is a bottom view of a display device according to another exemplary embodiment of the present disclosure.

The embodiment of FIG. 33 differs from the embodiments of FIGS. 1 through 6 in that a first heat dissipation film 130 is disposed to cover a part of the surface of a first substrate 111, rather than the entire surface of the first substrate 111. The embodiment of FIG. 33 will hereinafter be described, focusing mainly on the difference(s) with the embodiments of FIGS. 1 through 6.

Referring to FIG. 33, a first heat dissipation film 130 may be disposed to cover a part of the surface of a first substrate 111, rather than the entire surface of the first substrate 111. Since the first heat dissipation film 130 is for dissipating heat generated by a first sound generator 210, the first heat dissipation film 130 may overlap with the first sound generator 210. In this embodiment, the width, in a first direction (e.g., an X-axis direction), of the first heat dissipation film 130 may be greater than the width, in the first direction (e.g., the X-axis direction), of the first sound generator 210, and the width, in a second direction (e.g., a Y-axis direction), of the first heat dissipation film 130 may be greater than the width, in the second direction (e.g., the Y-axis direction), of the first sound generator 210.

The first heat dissipation film 130 may include an extended part 130a extending from an overlapping part that overlaps with the first sound generator 210 to a side of a display panel 110. The extended part 130a of the first heat dissipation film 130 may be in contact with a lower cover 102 (of FIG. 2) on the side of the display panel 110. The lower cover 102 may be disposed not only on the first heat dissipation film 130 and the first sound generator 210, but also on the side surfaces of the display panel 110.

Specifically, the metal layer of the extended part 130a of the first heat dissipation film 130 may be in contact with the metal of the lower cover 102. In this embodiment, a path may be provided via which heat generated by the first sound generator 210 may be delivered to the lower cover 102 through the metal layer of the first heat dissipation film 130, and as a result, the heat generated by the first sound generator 210 may be effectively released. Therefore, the influence of the heat generated by the first sound generator 210 on the display panel 110 may be minimized by the first heat dissipation film 130.

FIG. 33 illustrates that the extended part 130a of the first heat dissipation film 130 extends toward the upper side of the display panel 110, but the exemplary embodiments of the present inventive concepts are not limited thereto. For example, the extended part 130a of the first heat dissipation film 130 may extend toward the lower, left, or right side of the display panel 110.

While exemplary embodiments are described above, it is not intended that these embodiments describe all possible forms of the present inventive concepts. Rather, the words used in the specification are words of description rather than limitation, and it is understood that various changes may be made without departing from the spirit and scope of the inventive concept of the present disclosure. Additionally, the features of various implementing embodiments may be combined to form further embodiments of the present disclosure.

What is claimed is:

1. A display device comprising:
a display panel including a first substrate and a light-emitting element layer disposed on a first surface of the first substrate;
a first sound generator disposed on a second surface of the first substrate opposite to the first surface of the first substrate, the first sound generator configured to vibrate the display panel to output a first sound;
a first heat dissipation film between the first substrate and the first sound generator; and
a second heat dissipation film between the first dissipation film and the first sound generator.

2. The display device of claim 1, wherein the first heat dissipation film includes a metal layer formed of graphite, silver, copper, or aluminum.

3. The display device of claim 1, wherein the second heat dissipation film includes a metal layer formed of copper or aluminum, a ceramic layer having a piezoelectric material, or aerogel.

4. The display device of claim 1, wherein a thickness of the second heat dissipation film is lower than a thickness of the first heat dissipation film.

5. The display device of claim 1, wherein the first heat dissipation film is disposed on an entire of the second surface of the first substrate.

6. The display device of claim 1, wherein the second heat dissipation film is disposed on a portion of the second surface of the first substrate.

7. The display device of claim 1, wherein a width of the first sound generator in one direction is larger than a width of the second heat dissipation film in the one direction.

8. The display device of claim 7, wherein a width of the first sound generator in one direction is smaller than a width of the second heat dissipation film in the one direction.

9. A display device comprising:
a display panel including a first substrate and a light-emitting element layer disposed on a first surface of the first substrate;
a first sound generator disposed on a second surface of the first substrate opposite to the first surface of the first substrate, the first sound generator configured to vibrate the display panel to output a first sound; and
a heat dissipation film between the first substrate and the first sound generator,
wherein the heat dissipation film includes:
a heat dissipation layer; and
a first vibration transmission layer disposed on a first surface of the heat dissipation layer.

10. The display device of claim 9, wherein the first vibration transmission layer is between the heat dissipation layer and the first sound generator.

11. The display device of claim 9, wherein the heat dissipation layer includes a metal layer formed of graphite, silver, copper, or aluminum.

12. The display device of claim 9, wherein the first vibration transmission layer includes a polyimide.

13. The display device of claim 9, wherein the heat dissipation layer does not overlap the first sound generator.

14. The display device of claim 9, wherein the first sound generator includes:
a bobbin disposed on the first surface of the heat dissipation film;
a voice coil surrounding the bobbin; and
a magnet spaced apart from the bobbin, and
wherein the heat dissipation layer does not overlap the bobbin.

15. The display device of claim 14, wherein the heat dissipation film includes a first portion which overlaps the first sound generator and a second portion which does not overlap the first sound generator, and
wherein a thickness of the first portion is lower than a thickness of the second portion.

16. The display device of claim 15, wherein the heat dissipation film is disposed at the second portion.

17. A display device comprising:
a display panel including a first substrate and a light-emitting element layer disposed on a first surface of the first substrate;
a first sound generator disposed on a second surface of the first substrate opposite to the first surface of the first substrate, the first sound generator configured to vibrate the display panel to output a first sound;
a second sound generator disposed on the second surface of the first substrate, the second sound generator configured to vibrate the display panel to output a second sound; and
a first heat dissipation film between the first substrate and the first sound generator.

18. The display device of claim 17, wherein the first heat dissipation film is between the first substrate and the second sound generator.

19. The display device of claim 17, further comprising: a second heat dissipation film between the first substrate and the second sound generator.

20. A display device comprising:
a display panel including a first substrate and a light-emitting element layer disposed on a first surface of the first substrate;
a first sound generator disposed on a second surface of the first substrate opposite to the first surface of the first substrate, the first sound generator configured to vibrate the display panel to output a first sound;
a heat dissipation film between the first substrate and the first sound generator, and
wherein the heat dissipation film includes an extended portion which extends toward a side of the display panel.

* * * * *